United States Patent [19]
Sugimoto et al.

[11] Patent Number: 5,777,610
[45] Date of Patent: Jul. 7, 1998

[54] SMALL-SIZED, LIGHTWEIGHT DISPLAY DEVICE EASY TO REWORK AND METHOD OF ASSEMBLING THE SAME

[75] Inventors: Shinichi Sugimoto, Nara; Katsunori Nagata, Ikoma-gun; Yasunobu Tagusa, Ikoma, all of Japan

[73] Assignee: Sharp Kabushiki Kaisha, Osaka, Japan

[21] Appl. No.: 331,362

[22] Filed: Oct. 27, 1994

[30] Foreign Application Priority Data

Oct. 28, 1993 [JP] Japan ................................. 5-270335
Dec. 24, 1993 [JP] Japan ................................. 5-327507

[51] Int. Cl.⁶ ............................................. G09G 5/00
[52] U.S. Cl. ............................. 345/206; 345/87; 29/854
[58] Field of Search .......................... 345/205, 206; 359/54, 83, 87, 88, 98; 29/854, 857; 361/679, 681, 686, 721, 716, 735, 790

[56] References Cited

U.S. PATENT DOCUMENTS

| | | | |
|---|---|---|---|
| 4,367,581 | 1/1983 | Kohler | 29/854 |
| 4,468,659 | 8/1984 | Ohba et al. | 345/206 |
| 4,658,375 | 4/1987 | Onogi et al. | 361/686 X |
| 4,836,651 | 6/1989 | Anderson | 359/54 |
| 5,117,300 | 5/1992 | Wiemer | 359/88 |
| 5,200,847 | 4/1993 | Mawatari et al. | 359/54 X |
| 5,493,476 | 2/1996 | Burns | 361/735 |
| 5,592,199 | 1/1997 | Kawaguchi et al. | 345/206 |

FOREIGN PATENT DOCUMENTS

| | | |
|---|---|---|
| 4-157494 | 5/1992 | Japan. |
| 5-188390 | 7/1993 | Japan. |

*Primary Examiner*—Regina Liang
*Attorney, Agent, or Firm*—David G. Conlin; Brian L. Michaelis

[57] ABSTRACT

In a display device, first flexible wiring boards each mounted with a drive IC are provided on opposite first and second sides of a display panel. Two second flexible wiring boards each mounted with a drive IC are provided on a third side adjoining the first and second sides of the display panel. A control board having electrode terminals for outputting a control signal is provided on a fourth side opposite the third side of the display panel. Each first flexible wiring board has input terminals and output terminals on opposite sides of a substrate thereof. Each second flexible wiring board input terminals and output terminals on adjoining sides of a substrate thereof. The output terminals of the first and second flexible wiring boards are connected with the associated electrode terminals of the display panel. The input terminals of the first flexible board on either side and the input terminals of each second flexible board are arrayed in a line and are connected with circuit wirings of a circuit board placed on the first and second sides of the display panel. The circuit wirings are also connected with the electrode terminals of the control board by a connector.

11 Claims, 29 Drawing Sheets

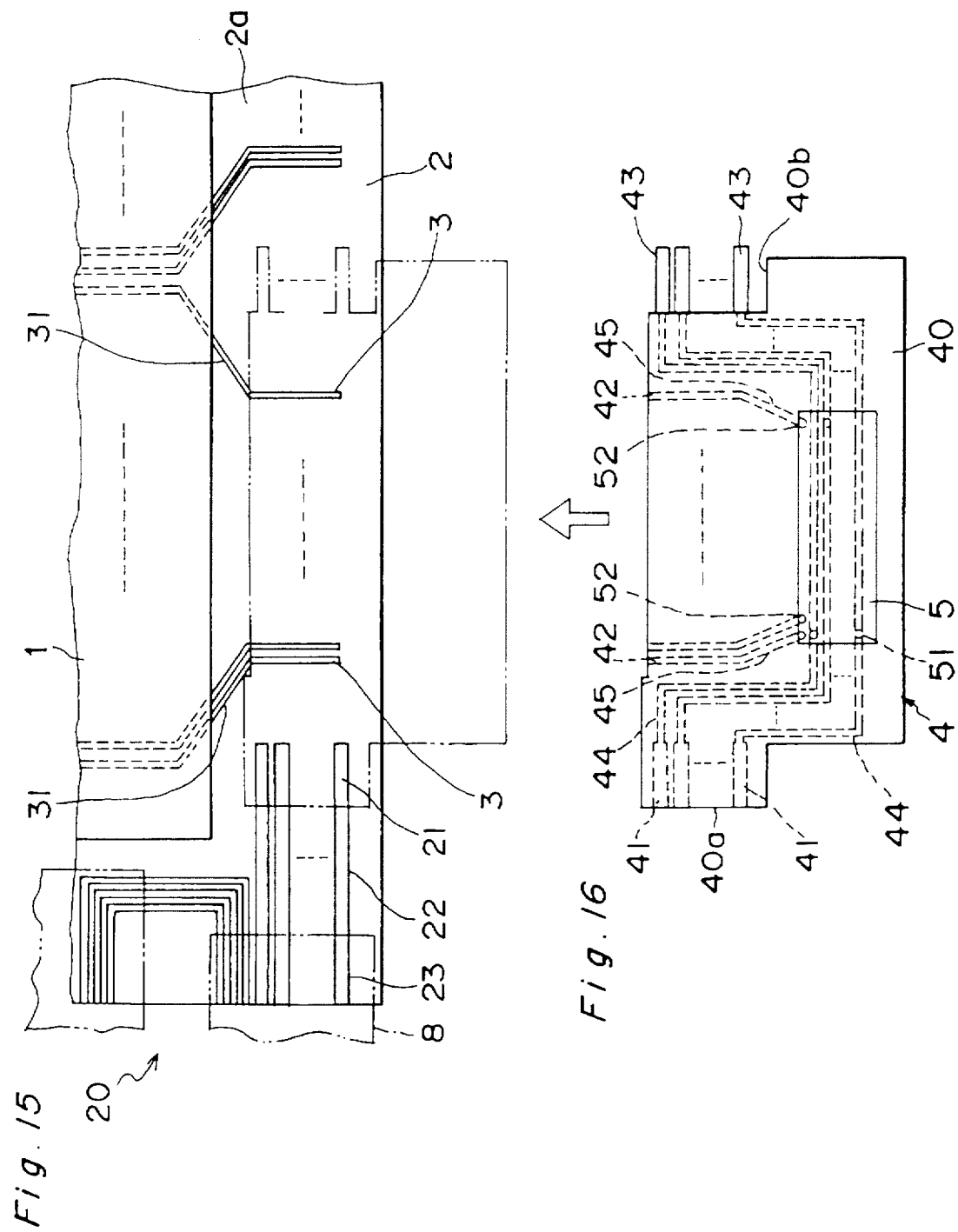

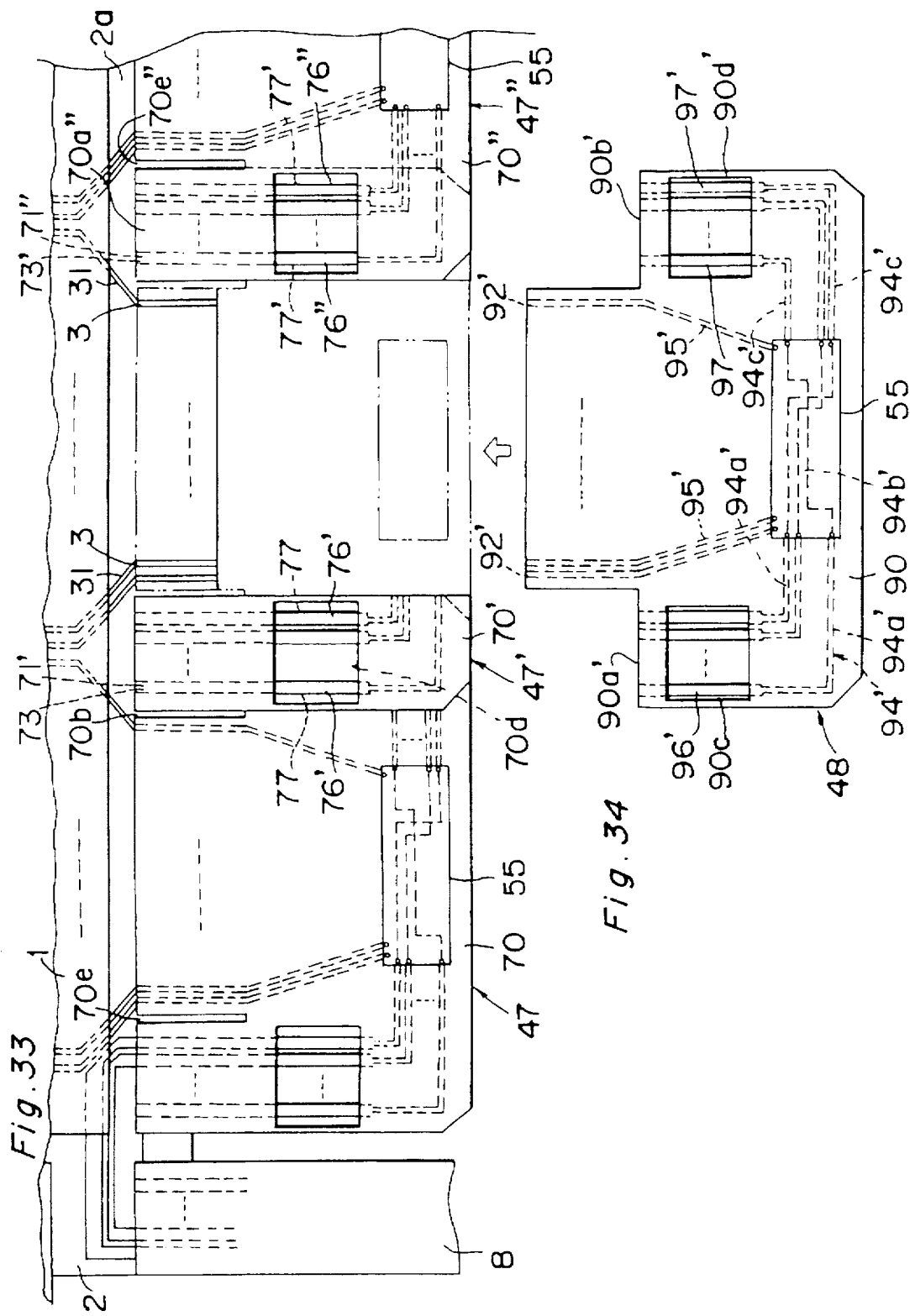

SMALL-SIZED, LIGHTWEIGHT DISPLAY DEVICE EASY TO REWORK AND METHOD OF ASSEMBLING THE SAME

BACKGROUND OF THE INVENTION

1. Field of the Invention

The present invention generally relates to a display device including a display panel, such as a liquid crystal display device, an EL (electroluminescence) display device, or a plasma display device, and a method of assembling the display device. The present invention relates in particular to a display device in which flexible wiring boards and other boards are connected to electrode terminals arranged in a peripheral portion of a display panel, and a method of assembling the display device.

2. Description of the Prior Art

FIG. 1 shows a perspective view of a conventional liquid crystal display device among a variety of display devices, while FIG. 2 shows a sectional view taken along the line 2—2 in FIG. 1. As shown in FIG. 1, the liquid crystal display device is provided with a display panel 11', a plurality of flexible wiring boards 502 and 508 mounted with respective drive ICs (integrated circuits) 16 and 15 for driving the display panel 11' on their substrates made of polyimide resin, circuit boards 501 and 501 which are provided along the display panel 11' to transmit a control signal to each of the flexible wiring boards 502, and a control board 602 for outputting the control signal.

As shown in FIG. 2, the display panel 11' is constituted by sealing liquid crystals 505 in a space between a pair of glass substrates 506 and 506' (the region in which the liquid crystals 505 are sealed up serves to display an image). Meanwhile, in a peripheral portion 12 of one glass substrate 506' is provided a number of electrode terminals 504 made of ITO (Indium Tin Oxide). The reference numeral 511 denotes a base coat (insulating layer). On the flexible wiring boards 502 and 508 are provided output terminals 606 and input terminals 507 which are made of Cu and connected to the drive ICs 16 and 15. The circuit boards 501 are each provided with a bus line 608 which extends in the lengthwise direction of the circuit board, and electrode terminals 604 connected with the bus line 608 and corresponding to the flexible wiring boards 502. As shown in FIG. 1, the control board 602 is provided with electronic parts for generating the aforementioned control signal, a bus line 608' for transmitting the control signal, and electrode terminals 603 connected with the bus line 608' and corresponding to the flexible wiring boards 508.

When assembled, the electrode terminals 504 in the peripheral portion 12 of the display panel 11' are connected with the output terminals 606 of the flexible wiring boards 502 and 508 via an anisotropic conductive film 607. Meanwhile, the input terminals 507 of the flexible wiring boards 502 and 508 are connected with the electrode terminals 604 of the circuit boards 501 and the electrode terminals 603 of the control board 602 by means of solder 605 (see FIG. 2), respectively. More specifically, the assembling steps are carried out according to a flow shown in FIG. 3. The solder 605 is firstly supplied to the electrode terminals 604 of the circuit boards 501 at step S101. Then at step S102, the anisotropic conductive film 607 is supplied onto the electrode terminals 504 located in the peripheral portion 12 of the display panel 11'. Then at step S103, the electrode terminals 504 of the display panel 11' are aligned with the output terminals 606 of the flexible wiring boards 502 and 508. At step S104, the electrode terminals 504 are connected with the output terminals 606 through,for example, heat contact bonding of the flexible wiring boards 502 and 508 and the display panel 11'. Then at step S105, the flexible wiring boards 502 and 508 are aligned with the circuit boards 501 and the control board 602. At step S106, the input terminals 507 are connected with the electrode terminals 604 by, for example, heating the flexible wiring boards 502 and 508 and the circuit boards 501 and the control board 602. Subsequently at step S107, the electrode terminals 603 of the control board 602 are connected with the bus lines 608 of the circuit boards 501 by connectors 601. The above-mentioned assembling technique is disclosed in Semiconductor World, special number, "'93 Novel Liquid Crystal Processing Technique—Technology•Equipment•Materials—" (written in Japanese)

In the operation stage of the liquid crystal display device, a control signal is supplied from the control board 602 to the bus lines 608 of the circuit boards 501 via the connectors 601. By way of the bus lines 608 and the input terminals 507 of the flexible wiring boards 502 and 508, the control signal is input to the drive ICs 16 and 15 of the flexible wiring boards 502 and 508. Signals output from the drive ICs 16 and 15 are applied to image display electrodes (not shown) formed on the opposite surfaces of the glass substrates 506 and 506' via the output terminals 606 and the electrode terminals 504 to drive the display panel 11' to display an image.

Lately, there has been a relentless competition in developing display devices, and there has been strong demands for reducing the size and weight of the device also with regard to the liquid crystal display devices. In the aforementioned conventional liquid crystal display device, however, because the flexible wiring boards 508 and the control board 602 are juxtaposed at one side of the display panel 11', the liquid crystal display device has a large size. Furthermore, since the control board 602 is large in size, the whole body of the liquid crystal display device becomes necessarily heavy. Furthermore, since the control board 602 is large in size, the connection portion of the board is susceptible to an external force. This results in a reduced reliability of the liquid crystal display device. Furthermore, because of a lot of connection portions existing in the entire display device, the probability of defective devices being produced is apt to increase and the production cost is high due to a large number of steps. Furthermore, the flexible wiring board 508 and the control board 602 are connected with each other by means of solder. Therefore, when the control board 602 is found to be defective after the assembling process is completed, it takes much time to replace the defective control board 602 with a good one (reworking).

SUMMARY OF THE INVENTION

Accordingly, an object of the present invention is to provide a display device which has a reduced size and weight and an improved reliability, which provides a lower probability of occurrence of defective, which can be assembled at lower costs, and which is easy to rework, and also to provide a method of assembling such a display device.

In order to achieve the aforementioned objective, a display device of the present invention comprises:

a display panel having a plurality of electrode terminals extending perpendicular to sides of the display panel and arranged along the sides in an peripheral portion of the display panel, said sides including at least one of first and second sides opposing each other, and including a third side adjoining the first and second sides;

a first flexible wiring board provided along the at least one of the first and second sides of the display panel, the first flexible wiring board having input terminals and output terminals on opposite sides of a substrate thereof and being mounted with a drive circuit for driving the display panel, said output terminals of the first flexible wiring board being connected with the electrode terminals of the display panel located along the at least one of the first and second sides of the display panel;

a second flexible wiring board provided along the third side of the display panel, said second flexible wiring board having input terminals and output terminals on adjoining sides of a substrate thereof and being mounted with a drive circuit for driving the display panel, said output terminals of the second flexible wiring board being connected with the electrode terminals of the display panel located along the third side of the display panel;

a control board provided on a fourth side opposite the third side of the display panel for generating a control signal for the drive circuits, said control board having electrode terminals for outputting the control signal;

a circuit board provided along the at least one of the first and second sides of the display panel and having circuit wirings for transmitting the control signal to the drive circuits of the first and second flexible wiring boards, one end of the circuit wirings being connected with the electrode terminals of the control board, wherein said input terminals of the first flexible wiring board are connected with the circuit wirings for transmitting the control signal to the drive circuit of the first flexible wiring board; and said input terminals of the second flexible wiring board are connected with the other end of the circuit wirings for transmitting the control signal to the drive circuit of the second flexible wiring board.

In the display device of the present invention having the above structure, the second flexible wiring board and the control board are arranged on the opposite third and fourth sides of the display panel, and not on the same side of the display panel. Consequently, the final product of the display device becomes smaller than the conventional display device where the flexible board and the control board are located on the same side of the panel. According to the present invention, the control board is only required to have electronic parts or an integrated circuit of the electronic parts for generating the control signal, and it is not necessary to provide the control board with such circuit wiring 608' and electrode terminals 603 as required in the conventional display device shown in FIG. 1. Therefore, the size of the control board is reduced in comparison with the conventional device, whereby the display device is made further compact. Due to such size reduction of the device, the device becomes lighter. Furthermore, since the size of the control board is reduced, possible influence of external forces exerted on the connection portions of the board is reduced, and reliability of the display device is thereby improved. The input terminals of the second flexible wiring board are connected with the circuit wiring of the circuit board, and not connected directly with the control board. This arrangement can decrease the number of connection portions. Thus, the probability of occurrence of a defective device decreases.

The input terminals of the first and second flexible wiring boards can be arranged in a line in a direction in which the circuit board extends. Thus, it is possible to connect all the input terminals of the flexible wiring boards with the circuit wirings of the circuit board at the same time by the use of a single tool. Accordingly, the number of assembling steps decrease and therefore cost reduction is achieved.

The display device of the present invention may comprise a plurality of the first flexible wiring boards arrayed along the at least one of the first and second sides of the display panel. Also, the display device may comprise a plurality of the second flexible wiring boards arrayed along the third side of the display panel. In even such cases, it is possible to connect all the input terminals of the flexible wiring boards with the circuit wirings of the circuit board at the same time by the use of a single tool.

The control board is not connected with the flexible wiring boards but connected with the circuit board by means of, for example, a connector. Therefore, when the control board is found to be defective after the assembling process, a work for replacing the control board with a good one (reworking) can be easily performed. The electrical inspection of the display panel can be performed only by pressing the input terminals of the first and second flexible wiring boards arranged in a line along the circuit board. Therefore, the inspection for deciding whether each part is good or not can be achieved efficiently.

In an embodiment of the present invention, the input terminals of the second flexible wiring board are provided symmetrically along two opposite sides of the substrate thereof, and the input terminals on one of the two sides are connected with the counterpart input terminals on the other side by respective bypass lines. Only the input terminals on the side closer to the circuit board of the second flexible wiring board are connected with the circuit wiring of the circuit board. The second flexible wiring board having the symmetric structure is very useful when the circuit board is provided on both of the first and second sides of the display panel, because this second flexible wiring board can be used for the circuit boards of either side. If the second flexible wiring board has input terminals on only one side, it is necessary to prepare two different types of second flexible wiring boards having the input terminals on opposite sides to each other.

In an embodiment of the present invention, part of the bypass wirings are provided on a substrate surface opposite from a substrate surface on which the input terminals are provided. In this arrangement, because space for provision of the bypass lines decreases, the size of the second flexible wiring board and hence the size of the whole display device can be made compact.

If the second flexible wiring board is provided with at least one dummy terminal on either side of an array of the output terminals, stress applied to the second flexible wiring board due to the thermal expansion and contraction of the circuit board can be eased.

In an embodiment of the present invention, the second flexible wiring board is provided with a slit or notch on either side of an array of the output terminals. Therefore, stress applied to the second flexible wiring board due to the thermal expansion and contraction of the circuit board can be eased.

In an embodiment of the present invention, those portions of the first flexible wiring board and the second flexible wiring board that protrude from the display panel edge are bent toward the front surface or the rear surface of the display panel, and the circuit board is superposed on the front surface or the rear surface of the display panel. Therefore, the display device is allowed to become further small-sized.

When an anisotropic conductive film is used to connect the electrode terminals of the display panel with the output terminals of the first and second flexible wiring boards and to connect the input terminals of the first and second flexible wiring boards with the circuit wirings of the circuit board, the connection can be easily performed.

It is preferred that overlapped portions of the display panel and the first and second flexible wiring boards, and overlapped portions of the first and second flexible wiring boards and the circuit board are each covered with a protection resin coat. This arrangement prevents the possible intrusion of moisture and gas into the above-mentioned portions, thereby improving reliability of the display device.

Further, the present invention provides a display device, comprising:

- a display panel having a plurality of electrode terminals extending perpendicular to sides of the display panel and arranged along the sides in an peripheral portion of the display panel, wherein the electrode terminals are divided into groups and the groups of the electrode terminals are spaced from each other;
- flexible wiring boards overlapping the display panel at the peripheral portion, each of which is mounted with a drive circuit for driving the display panel, each flexible wiring board having (a) a wiring layer which is connected with the drive circuit and which includes input terminals, output terminals and junction terminals and (b) circuit wirings connecting the input terminals with the junction terminals of the flexible wiring board; and
- circuit wirings connected with the flexible wiring board for transmitting a control signal received from outside to the drive circuits,
- wherein said output terminals of each flexible wiring board are connected in a superposed manner with an associated group of the electrode terminals, and said junction terminals of at least one flexible wiring board are connected in a superposed manner with the input terminals of the adjacent flexible wiring board, connected portions of the junction and input terminals of the adjacent flexible wiring boards being located on the peripheral portion of the display panel in a space between the adjacent groups of the electrode terminals.

The output terminals of each flexible wiring board are connected with the associated group of the electrode terminals of the display panel through a first connection material and the junction terminals of each flexible wiring board are connected with the input terminals of the adjacent flexible wiring board through a second connection material.

When this display device is in operation, a control signal is input to the input terminals of a first one of the flexible wiring boards directly or by way of a connector or circuit wirings from an external control board, and then input to the drive circuit. A signal output from the drive circuit of the first flexible wiring board is supplied to the inside of the display panel by way of the output terminals of the flexible wiring board and the electrode terminals of the associated first group of the display panel, whereby the display panel is driven. The control signal is transmitted to the junction terminals of the flexible wiring board by way of the circuit wirings and then supplied to the input terminals of the next flexible wiring board adjacent to the first flexible wiring board. Then the control signal is input to the drive circuit of the second flexible wiring board. A signal output from the drive circuit is supplied to the inside of the display panel by way of the output terminals of the second flexible wiring board and the associated electrode terminals of the second group of the display panel. In this way, the control signal from the external control board is successively supplied to the drive circuits of all the flexible wiring boards and the signal from the drive circuit of each flexible wiring board is successively supplied to the display panel.

This display device does not use a circuit board as used in the display device according to the first aspect of the present invention as well as in the conventional display device of FIG. 1. The module size and weight is reduced accordingly. Furthermore, since the number of parts is thus reduced, material cost is reduced.

Furthermore, because in an assembling process for this display device, there is no step of connecting the flexible wiring boards with a circuit board, and because all the flexible wiring boards can be connected with the display panel not individually but collectively and simultaneously due to locations of the input terminals, output terminals and junction terminals, the number of assembling steps decreases in comparison with the conventional case. The above arrangement results in cost reduction.

Furthermore, due to the reduced number of parts and the reduced size of the module, the resulting device is less susceptible to the influence of an external force. Furthermore, due to the reduced number of connection portions, the probability of occurrence of a defective device becomes low and reliability of the module is thus improved.

In order to replace a defective drive circuit mounted on a flexible wiring board already connected with the display panel, the drive circuit alone or along with a flexible wiring board substrate portion surrounding the drive circuit is removed from the flexible wiring board, and then, a new drive circuit alone or a substrate portion including a new drive circuit is connected with the flexible wiring board.

The first connection material for connecting the electrode terminals of the display panel with the output terminals of each flexible wiring board and the second connection material for connecting the junction terminals of the flexible wiring board with the input terminals of the next flexible wiring board may be of the same type. In this case, the material supply process is simplified. Therefore, the cost is further reduced. Furthermore, work of connecting the terminals is done under the same conditions for both the input terminal side and the output terminal side. This improves reliability of the device.

As the first and second connection materials of an identical type, an anisotropic conductive film can be utilized. Instead of the connection materials of the same type, materials of different types can be used. Since this material is currently one of principal connection materials, existing equipments and existing know-how of connection techniques can be utilized. Therefore, mass-production of the modules can be achieved in a short time with a small investment.

Instead of the connection materials of the same type, materials of different types may be used. In this case, materials suitable for the specification of resistance required for the connection portions are selected. Thus, reliability of the device increases. If the first connection material is an anisotropic conductive film and the second connection material is solder, existing equipments and existing know-how of connection techniques can be utilized. Therefore, mass-production of modules can be achieved in a short time with a small investment.

In an embodiment of the present invention, clip means made of a shape memorizing alloy or a shape memory resin is used for connecting with pressure the output terminals of each flexible wiring board with the associated group of the electrode terminals and connecting the junction terminals of each flexible wiring board with the input terminals of the adjacent flexible wiring board. Use of such clip means facilitate not only the connection of the flexible wiring board with the display panel but also the removal of the flexible wiring board from the display panel. More specifically, the flexible wiring board is removed only by removing the clip means. Therefore, for example, when a drive circuit mounted on a particular flexible wiring board is found to be defective after the assembling process, the flexible wiring board is readily replaced with a new one. In this case, no work to wipe the connection material off is required.

In an embodiment of the present invention, circuit wirings for transmitting the control signal to the drive circuits are provided at a corner of the peripheral portion of the display panel, and these circuit wirings are connected with the input terminals or the junction terminals of a flexible wiring board arranged closest to the corner of all of the plurality of flexible wiring boards. With such a simple construction, the external control signal is supplied to the drive circuit on the flexible wiring board.

Alternatively, a control board having the circuit wirings for transmitting the control signal to the drive circuits may be provided in the vicinity of the display panel, and the circuit wirings of the control board are connected with the input terminals or the junction terminals of a flexible wiring board closest to a corner of the peripheral portion of all of the plurality of flexible wiring boards. In this case, because it is not necessary to use a connector for connecting the control circuit and the flexible wiring board, the number of parts and the number of connection portions decrease. Therefore, the reliability is improved.

The module size can be further reduced by folding a portion of each of the flexible wiring boards that protrudes sidewise from the peripheral portion of the display panel around an edge of the peripheral.

An aspect of the present invention provides a flexible wiring board to be connected with a display panel, comprising:

a flexible substrate;

a drive circuit mounted on the substrate for driving the display panel;

a wiring layer provided on the substrate and connected with the drive circuit;

an array of output terminals to be connected with electrode terminals of the display panel, input terminals provided on one side of the array of the output terminals for receiving a control signal for the drive circuit from outside, and junction terminals provided on the other side of the array of the output terminals and connected with the input terminals by circuit wirings and adapted to be connected with input terminals of another flexible wiring board;

the output terminals, input terminals and junction terminals forming part of the wiring layer; and auxiliary input terminals and auxiliary junction terminals formed on the circuit wirings in the vicinity of the input terminals and the junction terminals, respectively.

When a display module uses flexible wiring boards having the above-mentioned construction, the following advantages are offered. That is, the number of parts, the number of steps of assembling the module, the size and weight of the device, and the cost decrease, and on the other hand, reliability of the device increases.

When a drive circuit mounted on the flexible wiring board is found to be defective after the assembling process, the defective drive circuit can be easily replaced in the following way. Firstly, the output terminals of the flexible wiring board are disconnected from the electrode terminals of the panel and central substrate portions including the output terminals and the drive circuit are removed from the flexible wiring board. At this time, there are left a first lateral substrate portion including the input terminals and the auxiliary input terminals and a second lateral substrate portion including the junction terminals and the auxiliary junction terminals. Then a new flexible wiring board is connected to the display panel and the adjoining flexible board or boards by connecting the output terminals, the auxiliary input terminals, and the auxiliary junction terminals of the new flexible wiring board with the electrode terminals of the panel, the auxiliary input terminals, and the auxiliary junction terminals of the first and second lateral portions left. In this way, the defective drive circuit is easily replaced. Portions of the new flexible wiring board including the input terminals and the junction terminals may be cut out.

Preferably, a slit is provided in the substrate between the array of the output terminals and an array of the input terminals and between the array of the output terminals and an array of the junction terminals.

Alternatively, a slit is provided in the substrate between the array of the output terminals and one of an array of the input terminals and an array of the junction terminals, and a portion of the substrate where the other of the array of the input terminals and the array of the junction terminals is located is cut out. When the flexible wiring board is connected with another flexible wiring board of the same construction, a further slit is formed by the cut-out portion being overlapped with the another flexible wiring board.

In these cases, when the central substrate portions including the output terminals and the drive circuit are removed from the flexible wiring board for the purpose of replacing of the drive circuit mounted thereon, only substrate portions protruding sidewise from the peripheral portion of the display panel are required to be cut almost perpendicularly to the length of the peripheral portion of the panel till the slit is reached. The cutting operation is not performed on the peripheral portion due to the presence of the slit. Thus, this cutting method does not damage the display panel.

In a method of assembling the display device according to an aspect of the present invention, the operation test is performed every time each flexible wiring board gets connected to the electrode terminals of the display panel. Therefore, any flexible wiring board which has a defective connection or a malfunctioning drive circuit can be immediately replaced. Therefore, when the connection steps are unstable, when the drive circuit easily breaks down electrostatically, or when the drive circuit is used without preliminary inspection, there is possibility that this method can reduce the number of times of reworking as a whole, in comparison with a method wherein the operation test is collectively performed after the completion of the module.

In another method of assembling the display device according to the present invention, first, the electrode terminals of alternate groups of the display panel flexible wiring boards are connected with the flexible wiring boards, and then, the connected flexible wiring boards are subjected to the operation test. In this stage, the flexible wiring boards are not overlapping each other. Therefore, when a defective connection or the electrostatic breakdown of a drive circuit is found, the relevant flexible wiring board is easily removed to be replaced. Subsequently, the electrode terminals of the other alternate groups of the display panel are connected with the flexible wiring boards and then the now connected flexible wiring boards are subjected to the operation test. In this stage, the newly connected flexible wiring boards overlap the previously connected flexible wiring boards. Therefore, when a defective connection or the electrostatic breakdown of a drive circuit is found, the relevant flexible wiring board is easily removed to be replaced. As described above, with this method, only the flexible wiring board that is found to be defective is readily removed and replaced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 15 is a plan view of the display panel peripheral portion of the liquid crystal display module of FIG. 12 in the state prior to the assembling;

FIG. 16 is a plan view of a flexible wiring board to be connected with the display panel of FIG. 15;

FIGS. 32 and 33 are plan views of the essential parts of the liquid crystal display module of FIG. 29 in different states to explain a method of removing a defective drive IC from the liquid crystal display module of FIG. 29;

FIG. 34 is a plan view of a flexible wiring board to be replaced with the flexible wiring board in the liquid display module of FIG. 32.

DETAILED DESCRIPTION OF THE PREFERRED EMBODIMENTS

Figure 4:
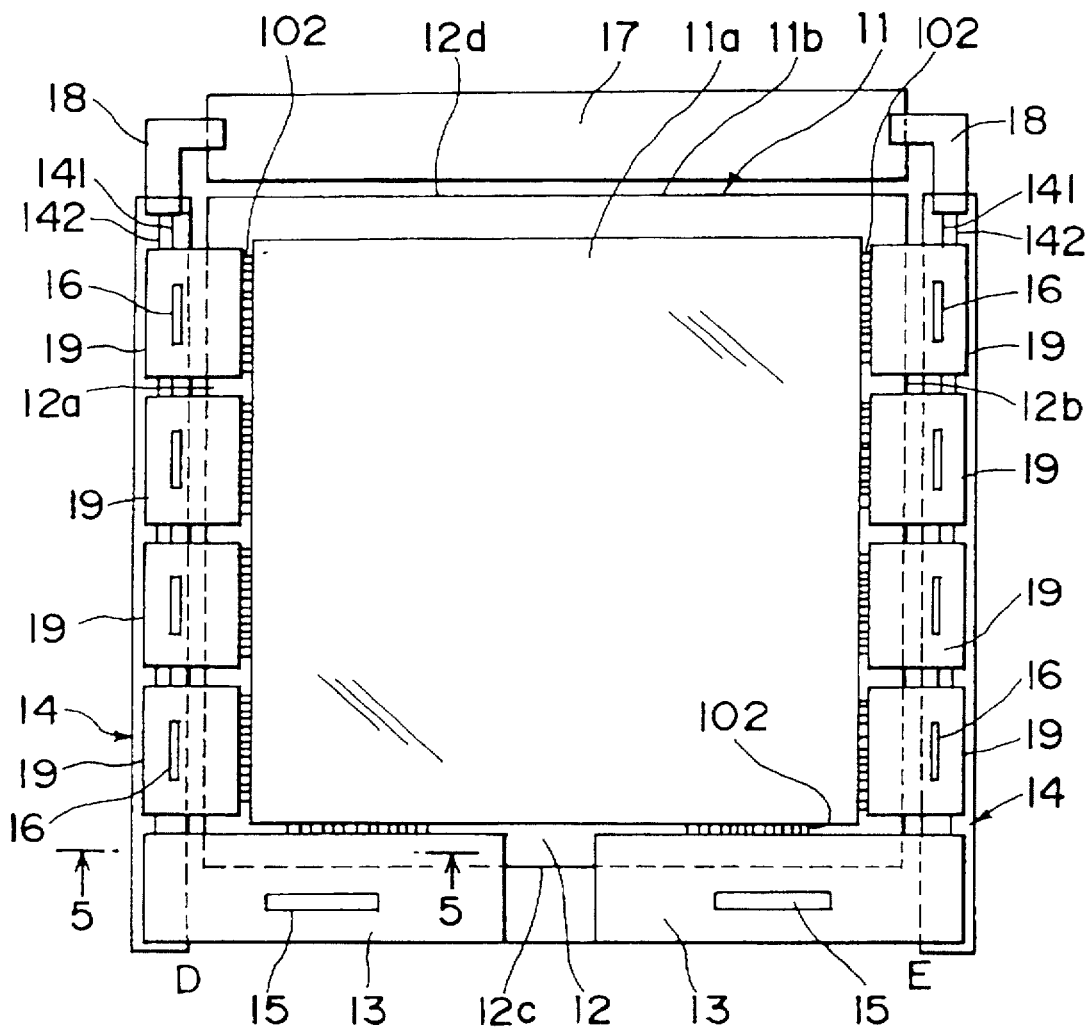
FIG. 4 is a plan view of a liquid crystal display device in accordance with an embodiment of the present invention.
Figure 5:
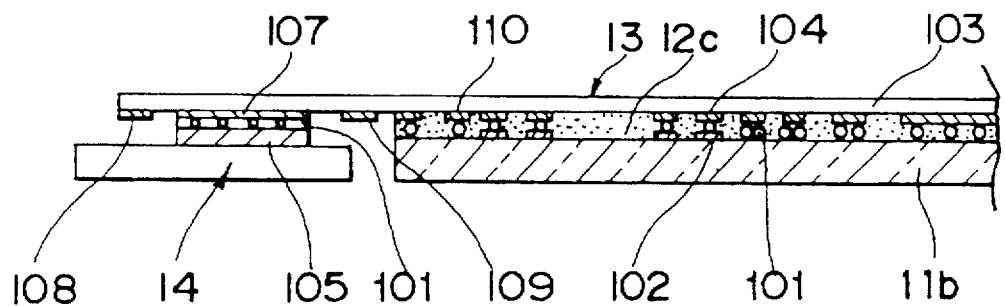
FIG. 5 is a sectional view taken along the line 5—5 in FIG. 4.

FIG. 4 shows the construction of the entire body of a liquid crystal display device in accordance with an embodiment of the present invention, and FIG. 5 shows a schematic sectional view taken along the line 5—5 in FIG. 4. The liquid crystal display device is provided with a display panel 11 constituted by sealing liquid crystals in a space between its glass substrates 11a and 11b. In a peripheral portion 12 of one glass substrate 11b is provided a plurality of electrode terminals 102. The electrode terminals extend perpendicular to the edge of the display panel substrate. Along each of mutually opposite first side 12a and second side 12b of the display panel 11 are arranged four first flexible wiring boards 19 each of which is mounted with a drive IC 16 for outputting a display signal for driving the display panel 11. Along a third side 12c adjacent to the sides 12a and 12b are arranged two second flexible wiring boards 13 each of which is mounted with a drive IC 15 for outputting a scanning signal for driving the display panel 11. Along the sides 12a and 12b are arranged circuit boards 14 and 14 having circuit wirings 141 and 142 (practically a plural number of wirings are provided for each of the circuit wirings, however, only one wiring of each is shown for simplicity in FIG. 4) for supplying a control signal to the drive ICs 16 and 15, respectively. Along a fourth side 12d opposite from the side 12c is provided a control board 17 for outputting the control signal. The control board 17 is provided at its both ends with electrode terminals (not shown) for outputting the control signal, and the electrode terminals are connected to the circuit wirings 141 and 142 of the circuit boards 14 via connectors 18. It should be noted that the end portions of the control board 17 and the end portions of each circuit board 14 can overlap each other.

Figure 6:
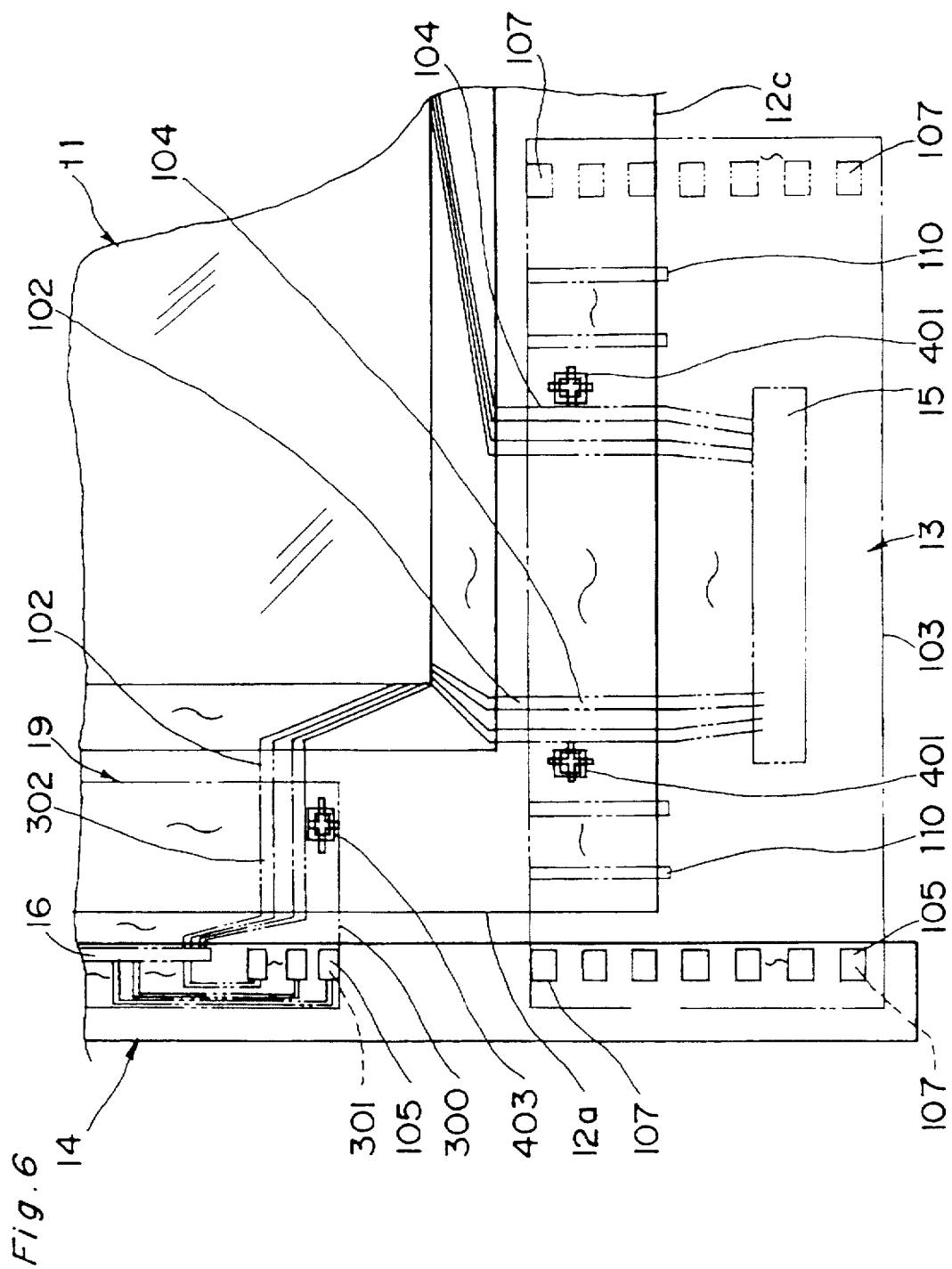
FIG. 6 illustrates an essential part of the liquid crystal display device of FIG. 4, wherein flexible wiring boards are drawn by dotted lines.

Referring to FIG. 6, each first flexible wiring board 19 is provided with output terminals 302 connected with the drive IC 16 along a side of its generally rectangular substrate 300, while input terminals 301 connected with the drive IC 16 are provided along a side opposite to the above-mentioned side. The output terminals 302 of the first flexible wiring boards 19 are connected with the electrode terminals 102 along the sides 12a and 12b of the display panel 11, while the input terminals 301 are connected with corresponding electrode terminals 105 (connected with the circuit wirings 141 shown in FIG. 4) of the circuit board 14. The corresponding terminals are connected with each other by an anisotropic conductive film 101.

The second flexible wiring board 13 is provided with output terminals 104 which are connected with the drive IC 15 and arranged along a side of its generally rectangular substrate 103, while lateral input terminals 107 are arranged symmetrically in FIG. 6 along sides adjacent to the above-mentioned side, as shown in FIG. 6. The symmetrical input terminals 107 are connected with each other by way of bypass lines (indicated by reference numerals 108 and 109 in FIG. 7). The reason why the input terminals 107 are provided laterally symmetrically and connected with each other by way of the bypass lines 108 and 109 is to allow the two flexible wiring boards 13 to have an identical pattern layout. Further, a plurality of dummy terminals 110 are provided on both sides of the array of the output terminals 104. As shown in FIG. 5, the output terminals 104 of the second flexible wiring boards 13 are connected with the electrode terminals 102 arranged along the side 12c of the display panel 11, while the input terminals 107 are connected with corresponding electrode terminals 105 (which are connected with the circuit wirings 142 shown in FIG. 4) provided in an end portion of the circuit board 14 extending alongside of the display panel 11. The reference numerals 401 and 403 denote alignment marks.

During the operation of the liquid crystal display device, the control signal is supplied from the control board 17 to the electrode terminals 105 by way of the connector 18 and the circuit wirings 141 and 142 of the circuit board 14. The signal (the display signal) which passes through the circuit wirings 141 is diverged at the electrode terminals 105 located in the intermediate portion of each circuit board and then supplied to the electrode terminals 102 on the sides 12a and 12b of the display panel 11 by way of the input terminals 301, drive ICs 16, and output terminals 302 of the flexible wiring boards 19. The signal (the scanning signal) which passes through the circuit wirings 142 is supplied from the electrode terminals 105 at the end portion of the circuit board 14 to the electrode terminals 102 on the side 12c of the display panel 11 by way of the input terminals 107, drive IC 15, and output terminals 104 of each flexible wiring board 13.

In the present assembly structure, the second flexible wiring board 13 is provided on the side 12c of the display panel 11, while the control board 17 is arranged on the side 12d opposite from the side 12c. Therefore, the liquid crystal display device of this embodiment can be made smaller in comparison with the conventional structure in which both the flexible wiring board and the control board are arranged on one side of the display panel. The control board 17 is not required to have a circuit wiring for supplying the signal to the flexible wiring boards, and is only required to have either electronic parts for generating the signal for driving the display panel 11 or an IC formed by integrating the electronic parts. Therefore, the control board 17 can be reduced in size in comparison with the conventional case. This results in the liquid crystal display device becoming compact and light.

Figure 8:
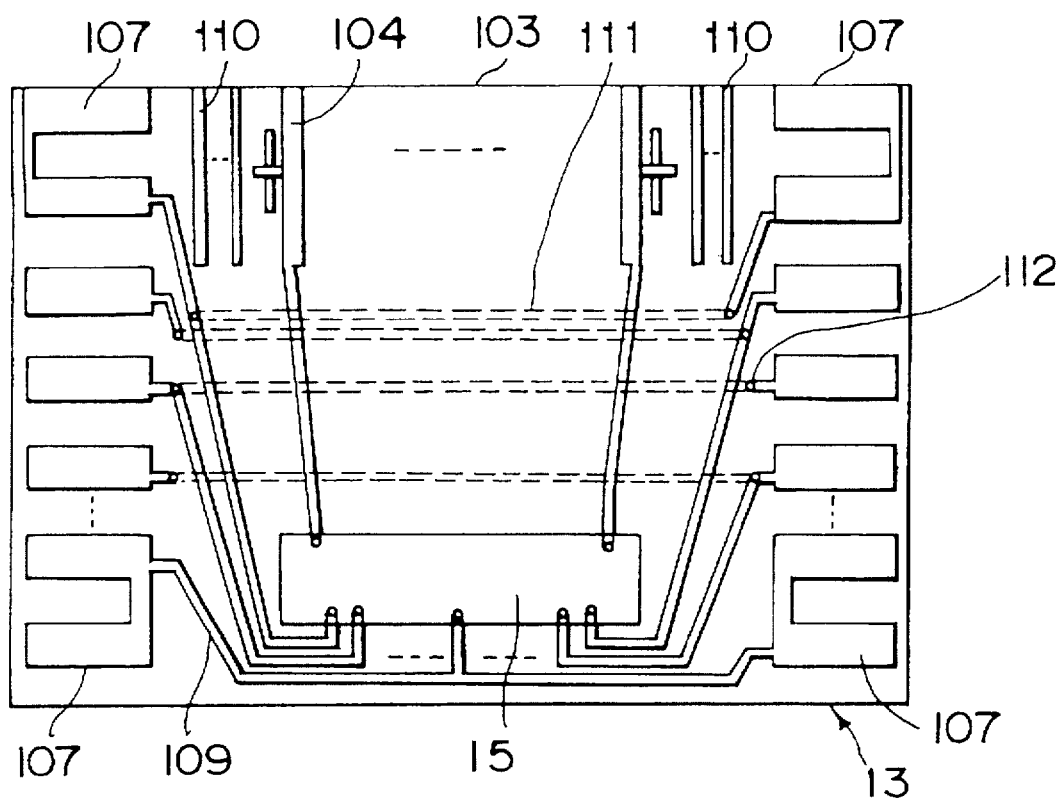
FIG. 8 is a plan view of another example of the second flexible wiring board of the liquid crystal display device.

If through holes 112 are provided in the second flexible wiring board 13 and part 111 of the bypass lines are arranged on a surface of the board opposite from the surface on which the input terminals 107 are provided, as shown in FIG. 8, the second flexible wiring board 13 is reduced in size. Therefore, the liquid crystal display device can be further small-sized.

Figure 11:
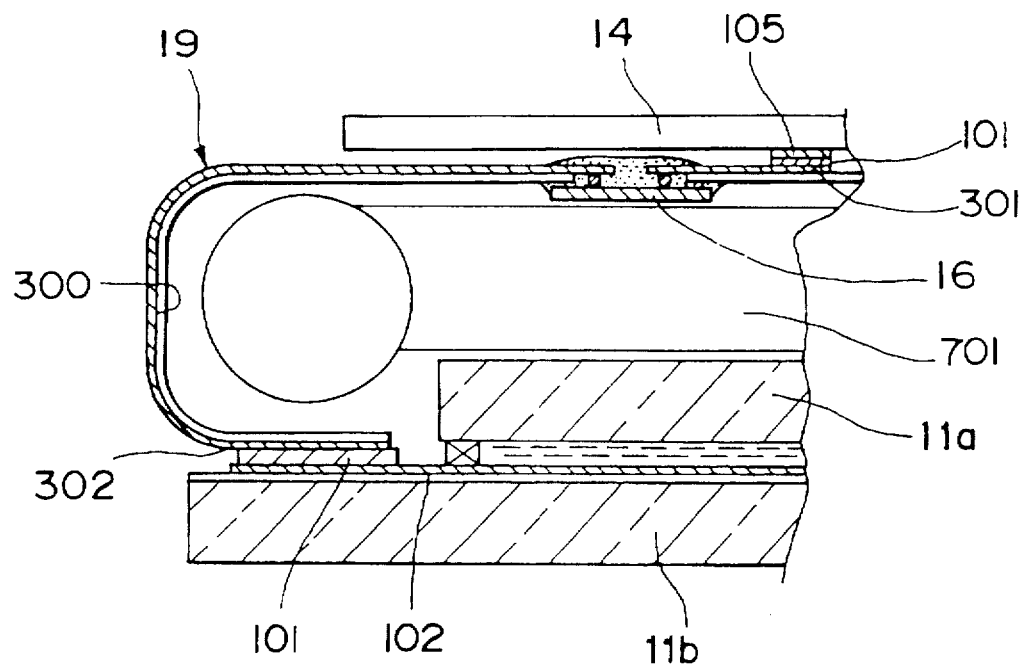
FIG. 11 is a sectional view of a panel peripheral portion in a variant of the liquid crystal display device.

Furthermore, if the first and second flexible wiring boards 19, 13 are bent in a position (indicated by reference characters D and E in FIG. 4) between the edge of the display panel substrate 11b and the circuit boards 14 toward the display panel such that those flexible wiring boards do not protrude from the periphery of the display panel, the liquid crystal display device becomes smaller. In this case the circuit boards 14 are superimposed on the display panel, as shown in FIG. 11. In the example of FIG. 11, the end portions on the side of the input terminals 301 of the first flexible wiring boards 19 are bent toward the rear surface of the display panel 11, being wrapped around a back light 701, and the circuit board 14 are superimposed on the rear surface of the display panel 11.

Furthermore, since the control board 17 is reduced in size for the above-mentioned reason, a possible influence of external forces on the connection portions of the board is reduced, so that reliability of the liquid crystal display device is improved. Furthermore, since the dummy terminals 110 are provided on the second flexible wiring board 13, a stress exerted on the second flexible wiring board 13 due to the thermal expansion and contraction of the circuit board 14 can be eased, whereby the reliability is further improved.

Figure 7:
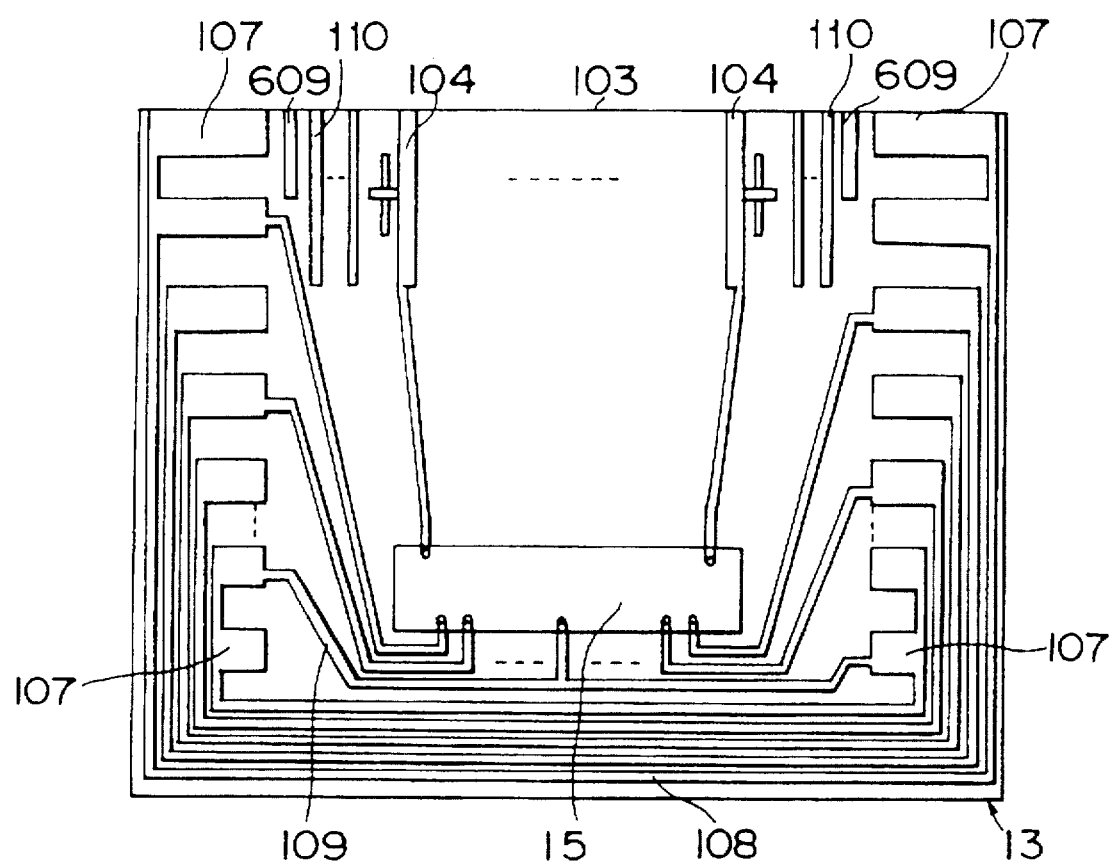
FIG. 7 is a plan view of an example of a second flexible wiring board of the liquid crystal display device.

Furthermore, if the substrate 103 of the second flexible wiring board 13 is provided with a notch or slit 609 on both sides of the array of the output terminals 104 and dummy terminals 110, as shown in FIG. 7, a stress exerted on the second flexible wiring board 13 due to the thermal expansion and contraction of the circuit board 14 can be also eased and reliability is further improved.

Figure 12:
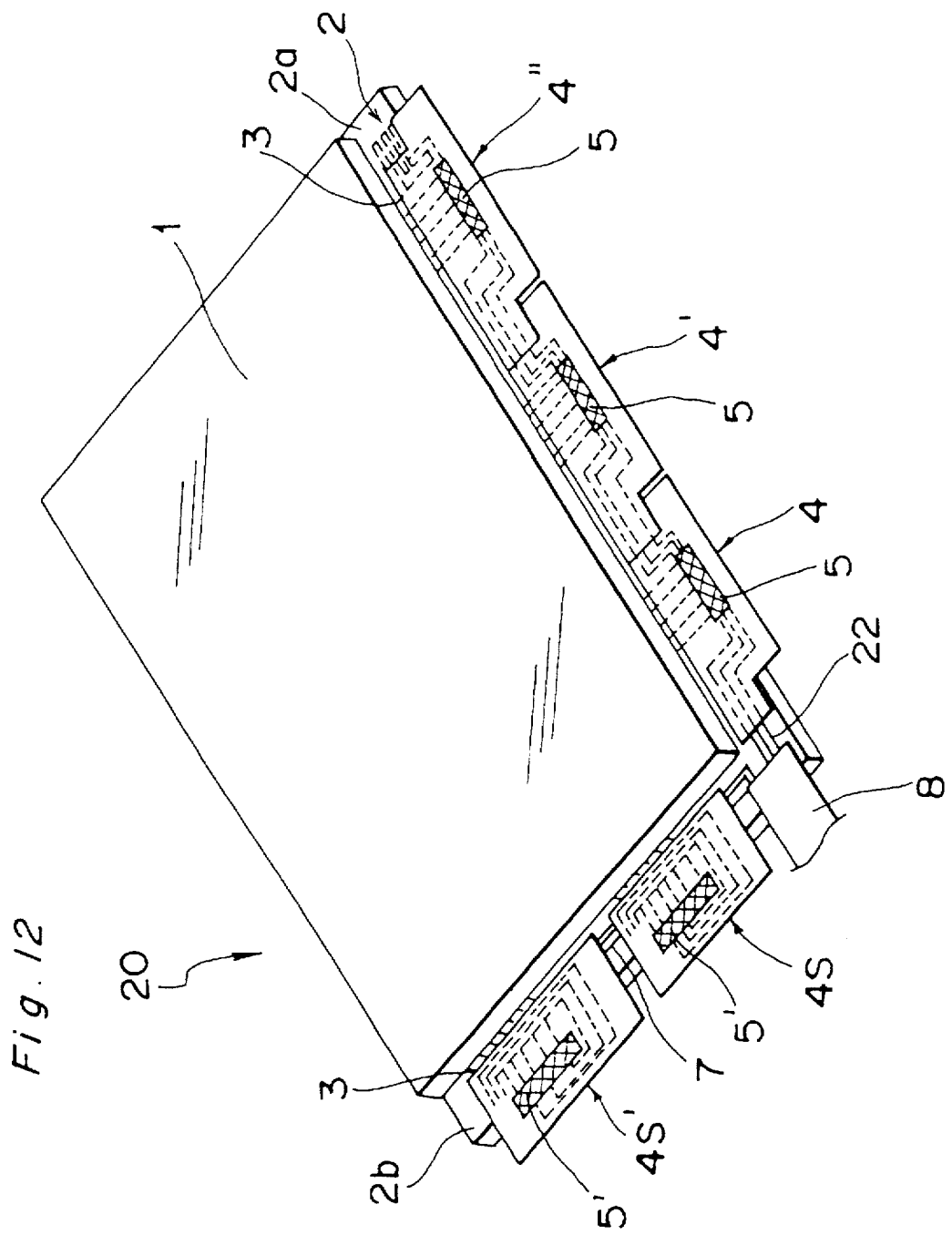
FIG. 12 is a perspective view of a liquid crystal display module of an embodiment of the present invention.

Furthermore, if the overlapped portions of the display panel 11 and each of the flexible wiring boards 19 and 13 as well as the overlapped portions of the flexible wiring boards 19 and 13 and the circuit board 14 are covered with a protection resin, as shown in FIG. 12, the possible entrance of moisture or gas into the above-mentioned portions can be prevented and the reliability is thus improved.

As seen from FIG. 6, the input terminals 107 of the second flexible wiring board 13 are connected with the electrode terminals 105 of the circuit board 14, i.e., the input terminals 107 are not directly connected with the control board 17. This arrangement reduces the number of connection portions of the display device as a whole and consequently reduces the probability of generation of defective devices. The control board 17 is not connected with the flexible wiring boards but connected with the circuit board 14 via the connector 18. Therefore, when the control board 17 is found to be defective even after assembled into the display device, replacement of the defective control board with a good one (reworking) can be easily performed. Furthermore, since an electric inspection of the display panel can be performed only by pressing the input terminals 301 and 107 of the flexible wiring boards 19 and 13 arranged in a line along the circuit boards 14 and 14, the inspection for deciding whether the device is good or not can be efficiently achieved.

Figure 9:
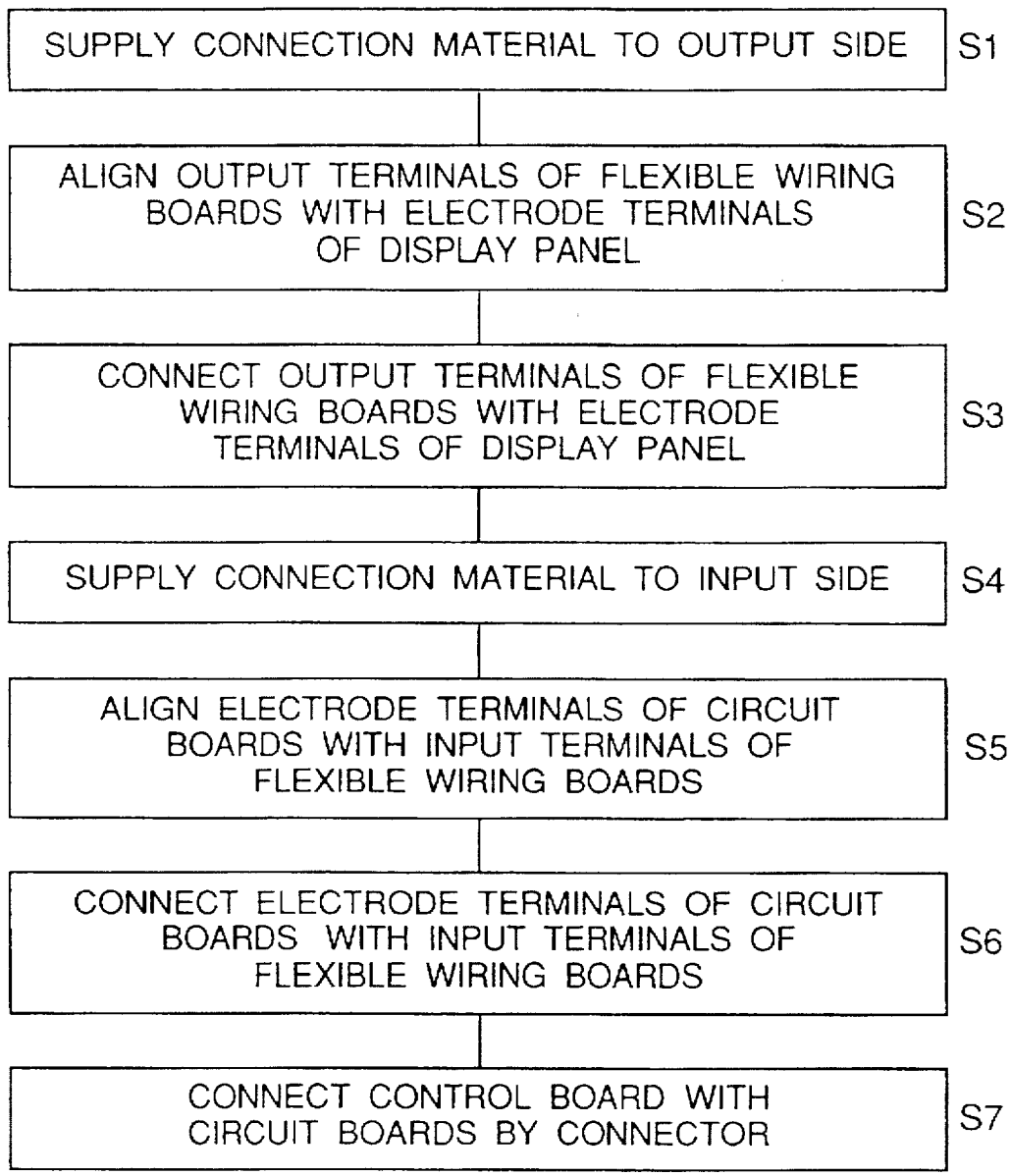
FIG. 9 is a flowchart of the steps of assembling the liquid crystal display device.
Figure 10:
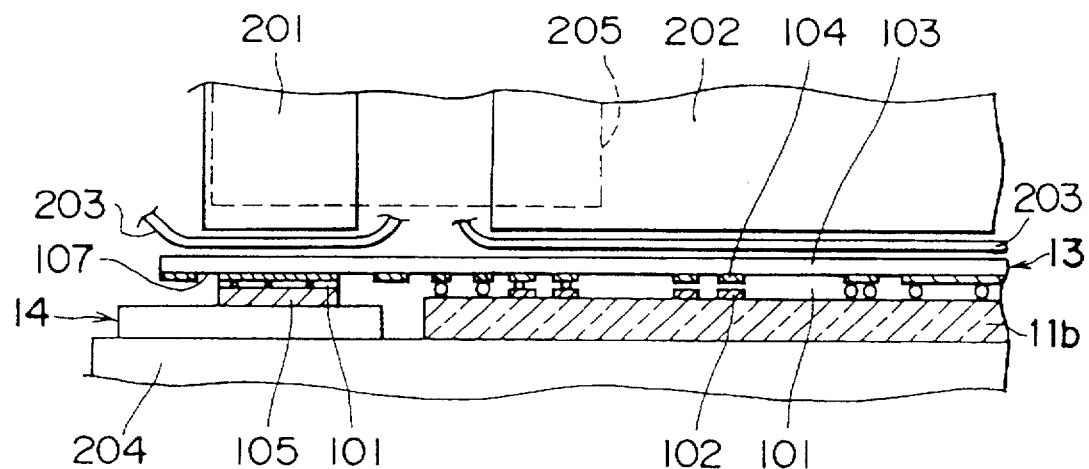
FIG. 10 is an explanatory sectional view illustrating connection of terminals of the liquid crystal display device.

The liquid crystal display device is assembled according to a process flow as shown in FIG. 9. At step S1, an anisotropic conductive film 101 serving as a connection material is heat-transferred onto the peripheral portion (the output side), generally denoted by reference numeral 12 in FIG. 4, of the display panel 11. Then at step S2, the electrode terminals 102 on the sides 12a and 12b of the display panel 11 are made to face the output terminals 302 of the first flexible wiring boards 19 and aligned with respective ones of the output terminals 302. On the other hand, the electrode terminals 102 on the side 12c of the display panel 11 are made to face the electrode terminals 104 of the flexible wiring boards 13 and aligned with respective ones of the output terminals 104. Then, at step S3, connection of the electrode terminals 102 of the display panel 11 with the output terminals 302 and 104 of the flexible wiring boards 19 and 13 is performed on a base mount 204 by applying a pressure and heat to the connection portions of those terminals by means of a thermal contact bonding tool 202 which has one or more pressing portions, as shown in FIG. 10, the tool being placed on the flexible wiring boards through a cushioning material 203. At this time, the output terminals 302, 104 of the flexible wiring boards 19 and 13 are arranged along the sides of the circuit boards 14. Then at step S4, the anisotropic conductive film 101 is heat-transferred as a connection material onto the electrode terminals 105 of the circuit boards 14. Then at step S5, the input terminals 301 and 107 of the flexible wiring boards 19 and 13 are made to face the electrode terminals 105 of the circuit boards 14 and aligned with respective ones of the electrode terminals 105. Then at step S6, the input terminals 301 and 107 of the flexible wiring boards 19 and 13 are connected with the electrode terminals 105 of the circuit boards 14 at the same time by applying a pressure and heat to the connection portions thereof by means of a thermal contact bonding tool 201 having one or more pressing portions. Thus the input terminals 301 and 107 of the flexible wiring boards 19 and 13 are simultaneously bonded with the electrode terminals 105 arranged on the circuit boards 14 through the use of one tool. The simultaneous bonding of the terminals reduces the number of steps and consequently cost reduction can be achieved. Finally at step S7, the electrode terminals at both ends of the control board 17 are connected with the terminals on the side of the control board 17 of the circuit wirings 141 and 142 on the circuit boards 14 by the connectors 18 in a manner as shown in FIG. 4. The connector 18 may be a rubber connector.

It is acceptable to increase the width of the pressing portion of the thermal contact bonding tool 201 as indicated by dotted line 205 in FIG. 10 to perform a simultaneous bonding or connection between the electrode terminals 102 of the display panel 11 and the output terminals 302 of the first flexible wiring board 19 and between the input terminals 301 and 107 of the flexible wiring boards 19 and 13 and the electrode terminals 105 of the circuit board 14.

Although in the above example the connecting operations are executed easily through the use of the anisotropic conductive film 101 which serves as a connection material, other connection materials such as solder, a photo-setting resin, etc. may be used instead.

FIG. 12 shows a perspective view of an LCD module in accordance with another embodiment of the present invention. An LCD panel 20 is constituted by sealing liquid crystals in a space between a pair of glass substrates 1 and 2. In a peripheral portion 2a of one glass substrate 2 are provided flexible wiring boards 4, 4' and 41" each of which is mounted with a drive IC 5 for driving the LCD panel 20. In another peripheral portion 2b of the glass substrate 2 are provided flexible wiring boards 4S and 4S' each of which is mounted with a drive IC 5' for driving the LCD panel 20. The peripheral portion 2a has a structure to which the present invention is applied. The structure of the peripheral portion 2b is out of the scope of the present invention.

Figure 13:
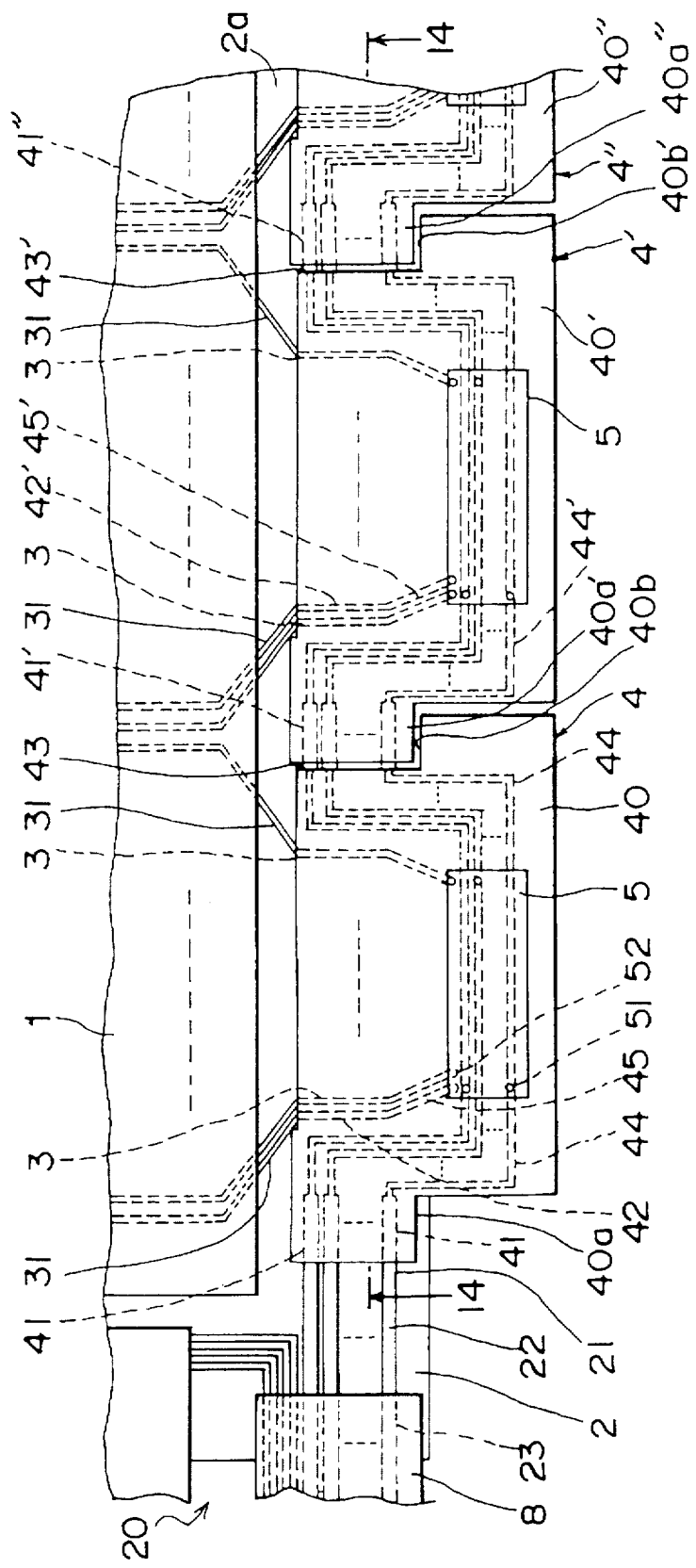
FIG. 13 is a plan view of essential parts including a display panel peripheral portion and flexible wiring boards of the liquid crystal display module of FIG. 12.
Figure 14:
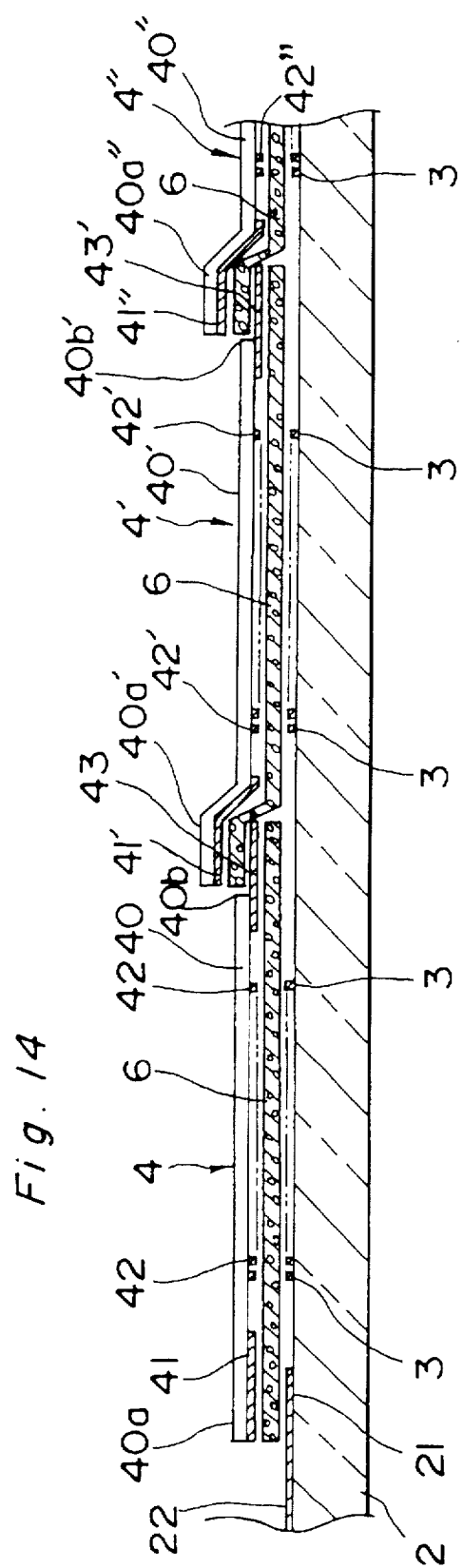
FIG. 14 is a sectional view taken along line 14—14 of FIG. 13.

FIG. 13 shows a top plan view of the peripheral portion 2a on a side of the LCD panel 20 and the flexible wiring boards 4, 4' and 4". FIG. 14 shows a sectional view taken along the line 14—14 in FIG. 13, while FIG. 15 shows the peripheral portion of the LCD panel 20 in a condition before the flexible wiring board 4 as shown in FIG. 16 is fitted. As shown in FIG. 13, in the peripheral portion 2a of the LCD panel 20 (glass substrate 2) there are provided a plurality of electrode terminals 3 along the length of the peripheral portion 2a. The electrode terminals extend perpendicular to the edge of the display panel substrate. The electrode terminals 3 are divided into groups corresponding to the flexible wiring boards 4, 4' and 4", and the adjacent groups of the electrode terminals 3 are spaced from each other. The electrode terminals 3 are connected to pixels (not shown) inside the panel via wirings 31. As shown in FIG. 15, circuit wirings 22 which are made of the same layer as that of the electrode terminals 3 and which transmit a signal to the drive IC 5 are provided at a corner of the peripheral portion 2a of the panel. One end proximate to the electrode terminals 3 of each circuit wiring 22 serves as a junction terminal 21 and the opposite end of the wiring serves as a connector terminal 23.

Figure 17:
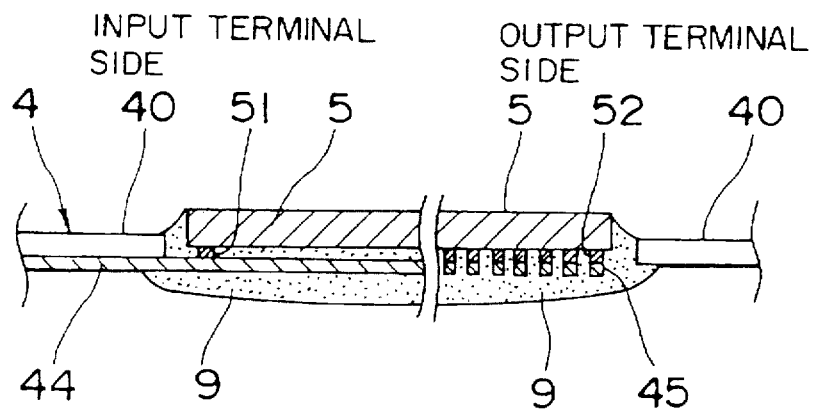
FIG. 17 is a sectional view of the vicinity of a drive IC mounted on a flexible wiring board.
Figure 18:
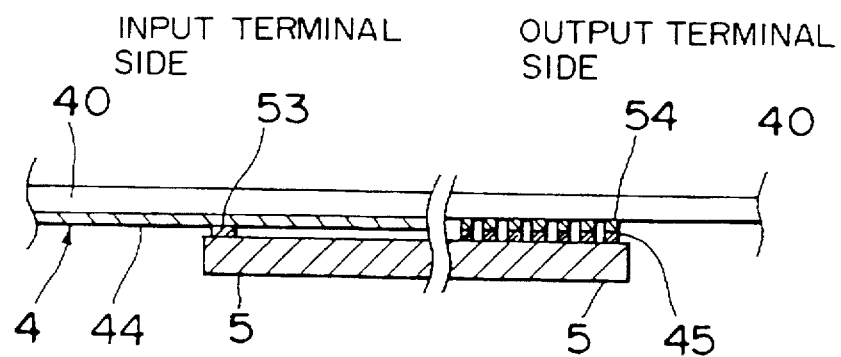
FIG. 18 is a sectional view of the vicinity of a drive IC mounted on a flexible wiring board.

On the other hand, the flexible wiring board 4 has, as shown in FIG. 16, its flexible substrate 40 mounted with the drive IC 5 and includes a wiring layer connected with the drive IC. The wiring layer is provided on the rear surface of the substrate, and includes input terminals 41, output terminals 42; and junction terminals 43. The output terminals 42, the input terminals 41, and the junction terminals 43 are provided respectively in a position corresponding to a group of the electrode terminals 3 in the peripheral portion 2a of the panel 2, in a position corresponding to a space on the left-hand side in FIG. 15 of the group, and in a position corresponding to a space on the right-hand side in FIG. 15 of the group. The generally rectangular substrate 40 has a rectangular protruding portion 40a in which the input terminals 41 exist and a rectangular recess portion 40b in which the junction terminals 43 exist. The flexible wiring board 4 is provided with generally U-shaped circuit wirings 44 for connecting the input terminals 41 with the junction terminals 43 beneath the drive IC. The output terminals 42 are connected with the drive IC 5 via wirings 45, while the input terminals 41 are connected with the drive IC 5 via the circuit wirings 44 which extend beneath the drive IC 5. In the example of FIG. 17, the drive IC 5 is mounted on the face or front surface of the substrate and connected with the wirings 44 and 45 by the protruding bump electrodes 51 and 52. The connected portions between the drive IC 5 and the substrate 40 is coated with a protection resin 9. The drive IC 5 may be mounted on the rear surface of the substrate via solder bumps 53 and 54, an anisotropic conductive film (not shown), or the like as shown in FIG. 18. Also, the circuit wirings 44 may be coated with an insulating resin in order to increase the reliability of insulation between the wirings. Furthermore, in order to improve the display quality, a capacitor, a resistor, or the like may be mounted on the flexible wiring board 4.

In the assembling stage, the flexible wiring board 4 is placed in opposition to the peripheral portion 2a of the LCD panel 20 as shown in FIGS. 15 and 16. Then the junction terminals 21 and the electrode terminals 3 of a first group in the peripheral portion 2a are respectively aligned with the input terminals 41 and the output terminals 42 of the flexible wiring board 4 on one-to-one basis. Then the junction terminals 21 and the electrode terminals 3 of the LCD panel 20 are simultaneously contact-bonded to the input terminals 41 and the output terminals 42 of the flexible wiring board 4 via a connection material 6 such as an anisotropic conductive film, solder, or a photo-setting resin. Though these steps, the corresponding terminals are electrically connected with each other collectively. Here, by utilizing the same connection material for both the side of the output terminals and the side of the input terminals of each flexible wiring board, the material supply process can be simplified.

Then, the second flexible wiring board 4' (having the same construction as that of the flexible wiring board 4) is placed in opposition to the peripheral portion 2a of the panel 20. Then the input terminals 41' and output terminals 42' of the flexible wiring board 4' are aligned with corresponding ones of the junction terminals 43 of the flexible wiring board 4 and the electrode terminals 3 of a second group of the panel 20. Then, the corresponding terminals are simultaneously connected with each other via the connection material 6.

Next, in the same manner as above, the third flexible wiring board 4" (having the same construction as those of the flexible wiring boards 4, 4') is placed opposite the peripheral portion 2a of the panel 20. Then junction terminals 43' of the flexible wiring board 4' and the electrode terminals 3 of a third group in the peripheral portion 2a of the panel 20 are respectively aligned with input terminals 41" and output terminals 42" of the flexible wiring board 4", and the corresponding terminals are connected with each other via the connection material 6 at the same time.

Subsequently, a control board (not shown) for supplying a signal for driving the LCD panel 20 is connected with the connector terminals 23 of the panel 20 via the connector 8 in a known manner. Due to the circuit wirings 22 including the connector terminals 23, the signal from the control board can be supplied to the input terminals of the flexible wiring board 4 with a simple construction of the device and the reduced number of parts and connection points.

In operation, a drive signal is supplied from the control board to the circuit wirings 22 in the peripheral portion 2a of the panel 20 via the connector 8. The signal is input from the junction terminals 21 to the drive IC 5 by way of the input terminals 41 and the circuit wirings 44 of the flexible wiring board 4. A signal output from the drive IC 5 is supplied to the pixels (not shown) of the LCD panel 20 by way of the wirings 45 and the output terminals 42 of the flexible wiring board 4, and the electrode terminals 3 and the wirings 31 of the first group located in the peripheral portion of the panel, whereby the LCD panel 20 is driven. The above-mentioned drive signal is diverged at the bump portion 51 and supplied to the input terminals 41' of the second flexible wiring board 4' by way of the circuit wirings 44 and the junction terminals 43 of the first flexible wiring board 4. Then the signal is input from the input terminals 41' to the drive IC 5 by way of the circuit wirings 44' of the flexible wiring board 4'. A signal output from the drive IC 5 is supplied to the LCD panel 20 by way of the output terminals 42' of the flexible wiring board 4' and the electrode terminals 3 of the second group in the panel peripheral portion 2a. In this way, the signal from the control board is successively supplied to the adjacent flexible wiring boards 4, 4' and 4".

Figure 1:
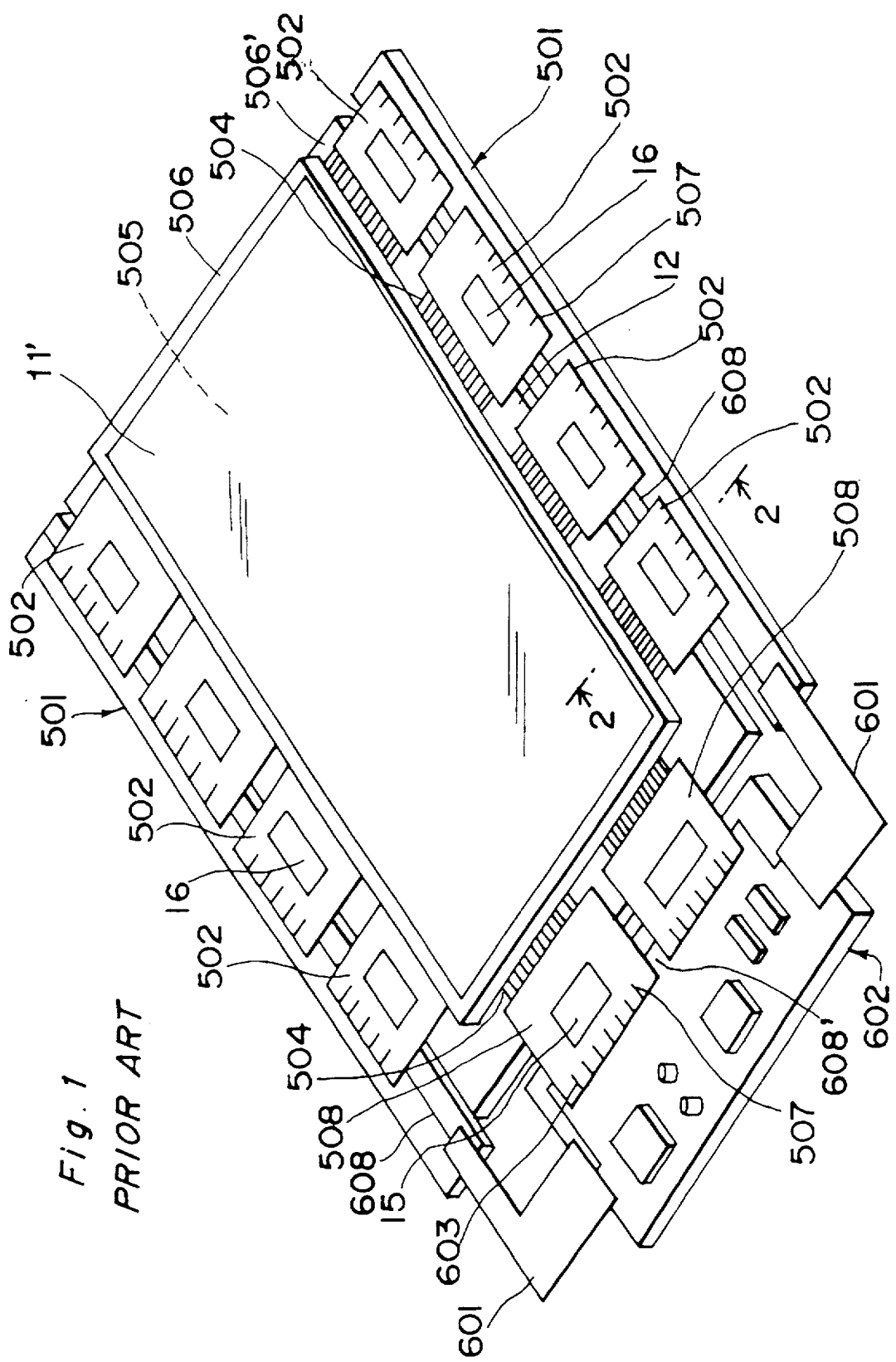
FIG. 1 is a perspective view of a conventional liquid crystal display device.
Figure 2:
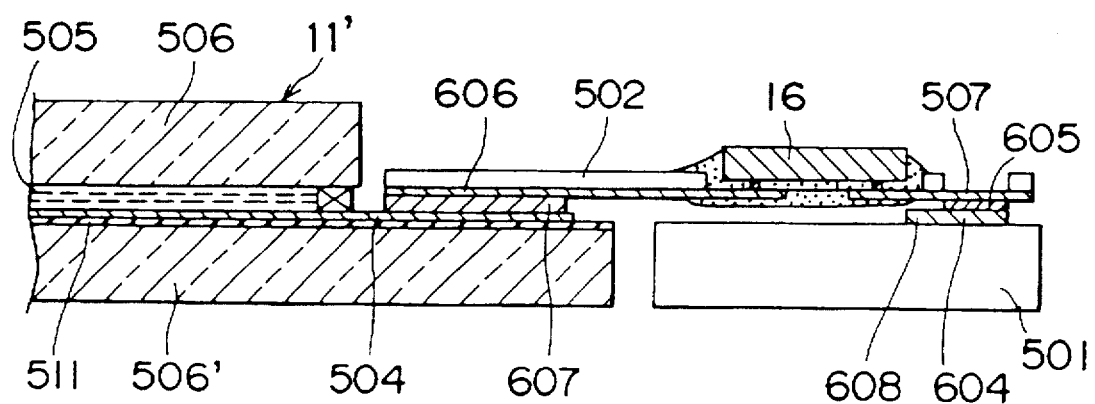
FIG. 2 is a sectional view taken along the line 2—2 in FIG. 1.
Figure 3:
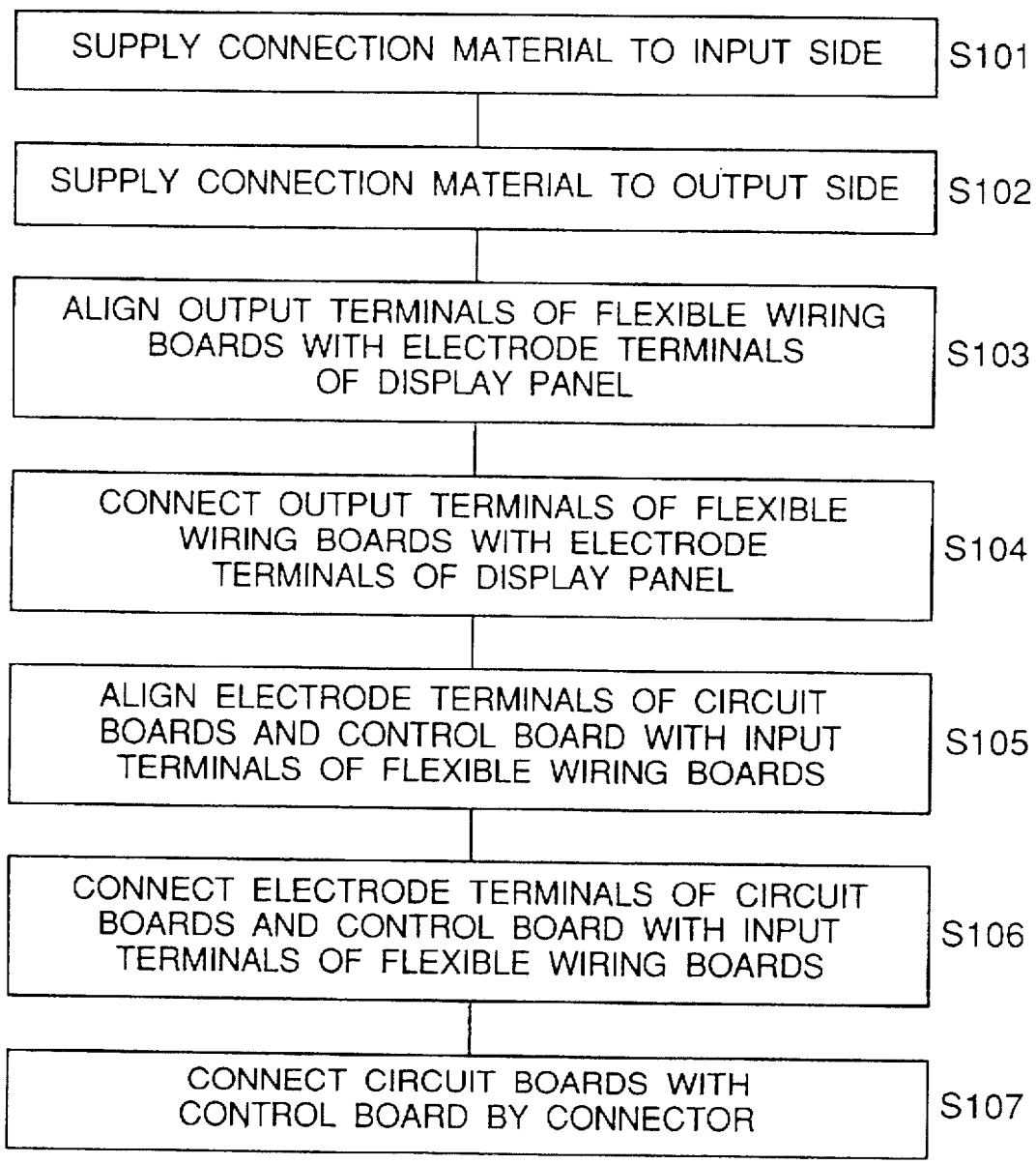
FIG. 3 is a flowchart of the assembling steps of the conventional liquid crystal display device.

In the LCD module shown in FIG. 12, a common wiring board which has been conventionally provided alongside the panel is eliminated. The circuit board provided in the display devices of FIG. 1 and FIG. 4 is also eliminated. Therefore the module can be reduced in size. Furthermore, because the number of parts decreases, the module is reduced in weight.

Furthermore, due to the decreased number of parts, the material cost can be reduced. Furthermore, the input terminals and the output terminals of the flexible wiring boards 4, 4', and 4" are collectively and simultaneously connected with the corresponding terminals in the panel peripheral portion through the use of the connection material 6 such as an anisotropic conductive film or the like. Furthermore, because neither a conventionally used common flexible wiring board nor a circuit board is used in the present LCD module, there are no steps of connecting the flexible wiring board 4 with such a common wiring board or a circuit board (although the control board is connected with the circuit wirings 22 located in the peripheral portion of the panel via a connector as conventionally done). Therefore, the number of steps decreases in comparison with the conventional case. This also allows cost reduction. Furthermore, because the LCD module includes fewer parts and is smaller in size in comparison with the conventional case, the device is less susceptible to external forces. Furthermore, because there are fewer connection portions, the probability of occurrence of defective can be reduced and thus reliability of the module increases.

Furthermore, in the present invention, because the connection material supply operation is simplified by using a connection material of the same type both on the side of the output terminals and on the side of input terminals of the flexible wiring boards 4, 4', and 4", a further cost reduction can be achieved, and the connection conditions can be made stable, so that the reliability is further improved. In particular, when the connection material is an anisotropic conductive film which is currently one of principal connection materials, existing equipments and existing know-how of connection techniques can be utilized. Therefore, mass-production of modules can be easily achieved in a short time with a small investment.

Figure 20:
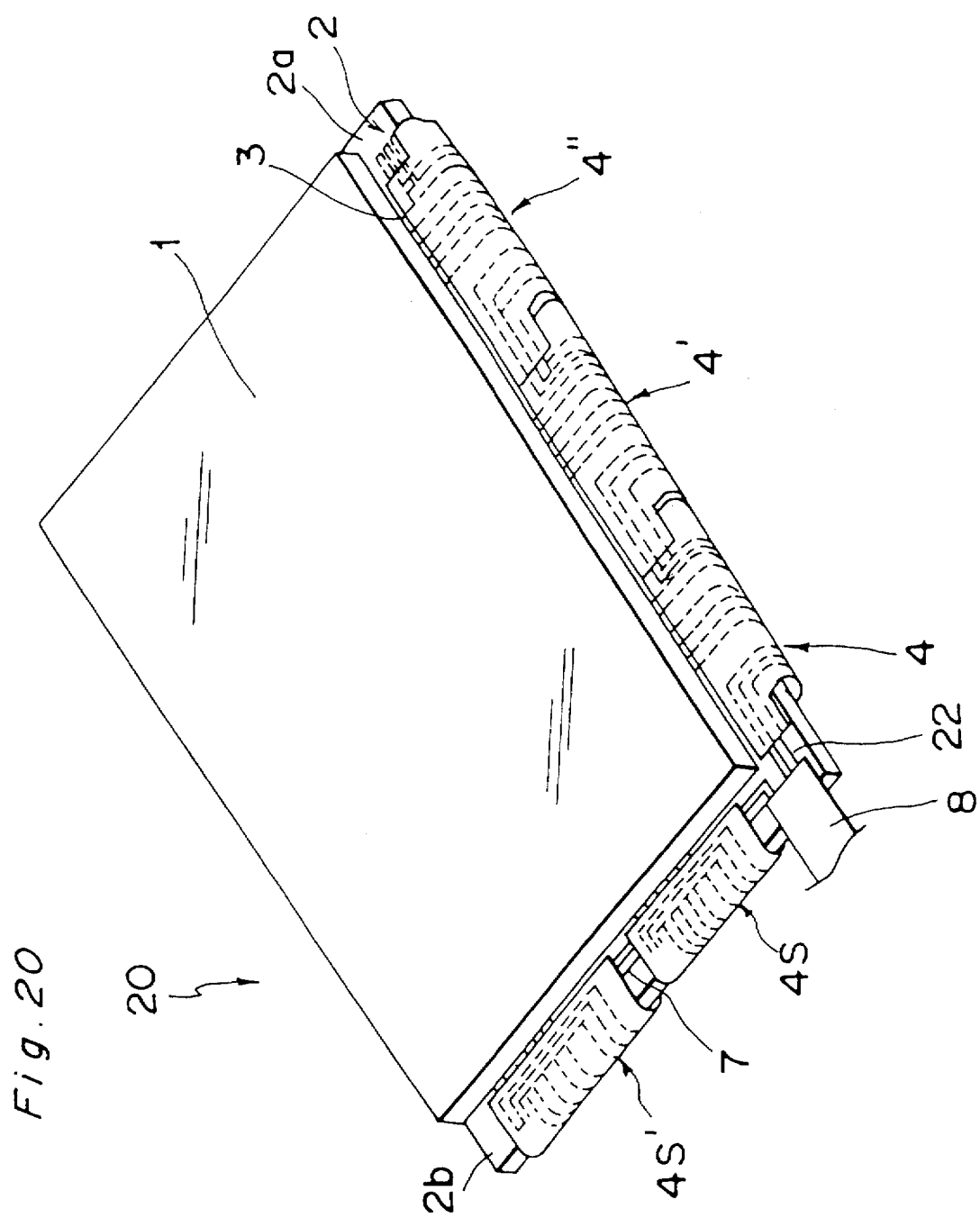
FIG. 20 is a perspective view of a liquid crystal display module of an embodiment of the present invention.

Those portions of the flexible wiring boards 4, 4', and 4' and flexible wiring boards 4S and 4S' that protrude from the respective edges of the LCD panel 20 may be folded back around the panel edges as shown in FIG. 20. When this arrangement is adopted, the size of the module can be further reduced.

Figure 21:
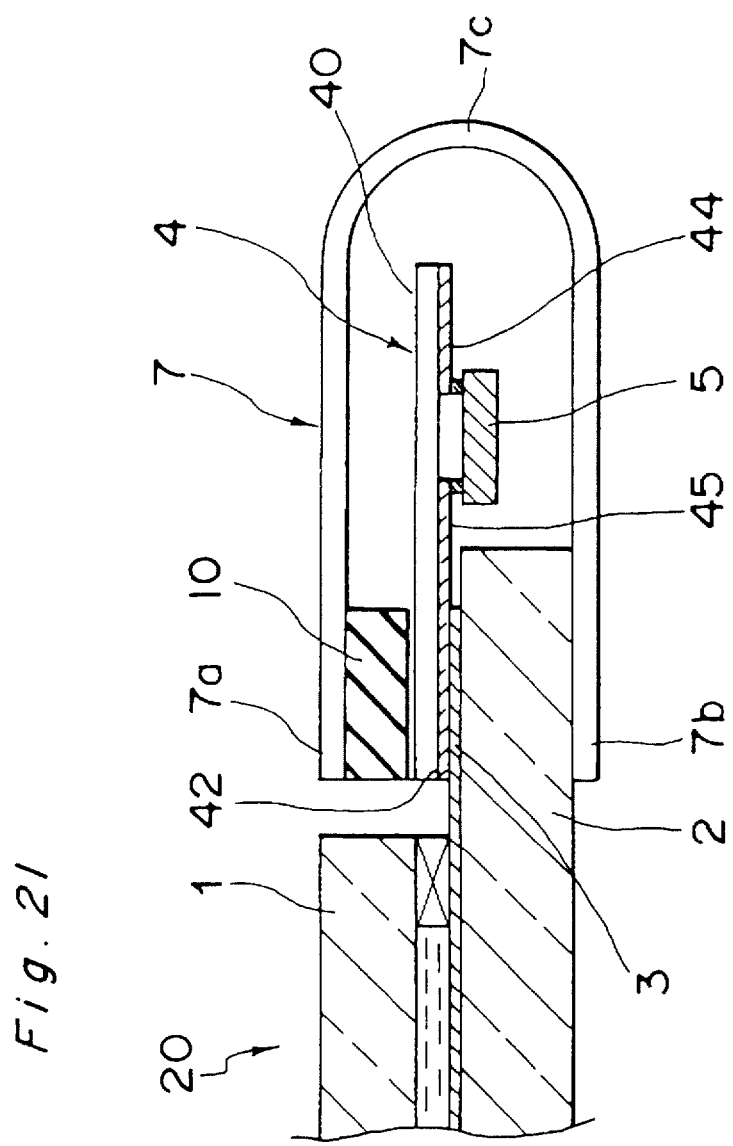
FIG. 21 is a sectional view illustrating a flexible wiring board being connected with a display panel by a clip.

Furthermore, instead of contact bonding the corresponding terminals of the flexible wiring boards and the LCD panel through the use of the connection material 6, those terminals may be connected with pressure by using a sectionally U-shaped clip 7 which is made of a shape memorizing alloy or a shape memory plastic, as shown in FIG. 21. When this connection method is adopted, the corresponding terminals can be connected with each other by end portions 7a and 7b of the clip 7 after the flexible wiring boards 4, 4' and 4" are positioned in alignment with the panel peripheral portion 2a. When a drive IC mounted on a particular flexible wiring board is found to be defective after the assembling process, the flexible wiring board including the defective drive IC is readily replaced only by removing the clip 7. Removal of the connection material is not required any more. In the present example shown in FIG. 21, a cushioning material 10 made of a rubber or the like is provided between the end portion 7a of the clip 7 and each of the flexible wiring boards for the following reason. That is, as shown in FIG. 14, there is a difference in total thickness between the region where the output terminals 42, 42', . . . of the flexible wiring boards 4, 4', . . . exist and the region where the junction terminals 43, 43', . . . exist (the adjacent flexible wiring boards overlap the portion). Therefore, the cushioning material 10 made of rubber or the like is provided to apply an appropriate pressure to each region.

Figure 22:
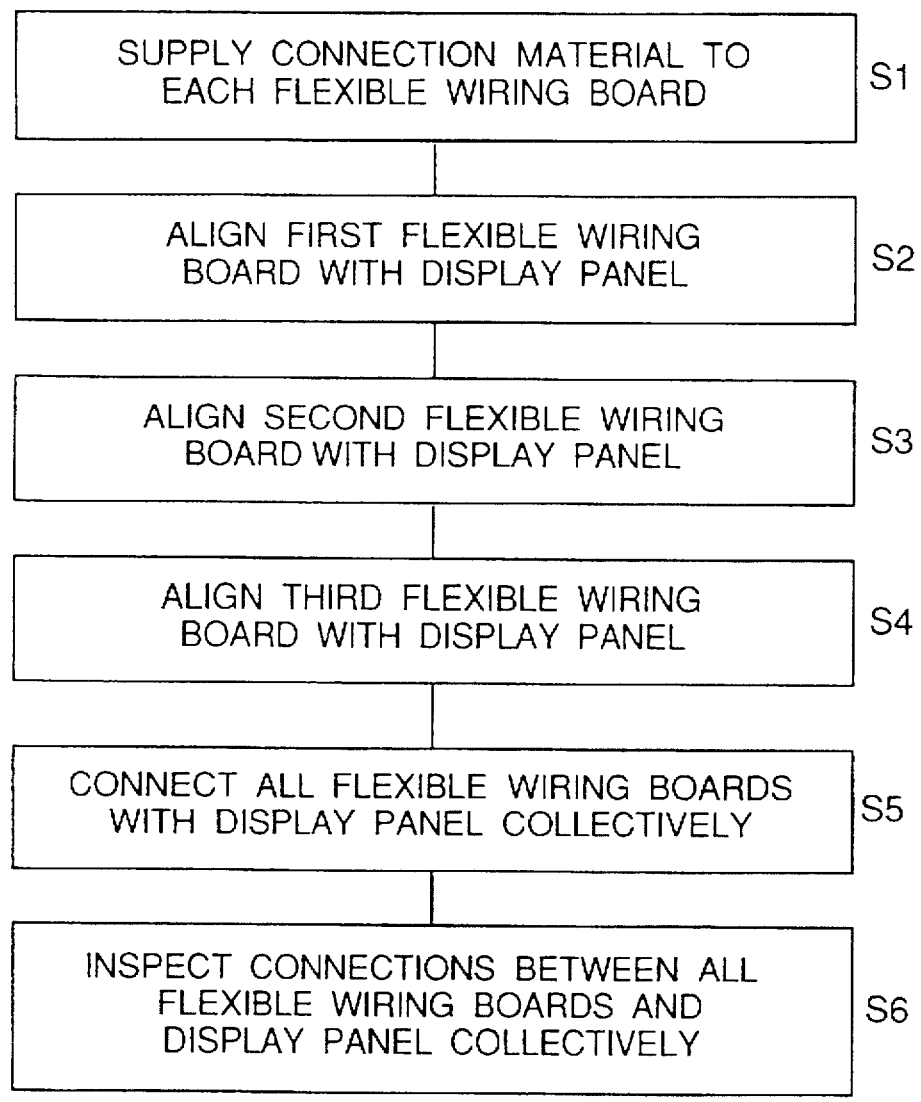
FIG. 22 is a flowchart of a method of assembling a liquid crystal display module of the present invention.

All the wiring boards 4, 4' and 4" can be simultaneously connected in accordance with a flow of FIG. 22. The following describes the flow. At step S1, the connection material 6 is supplied to the flexible wiring boards 4, 4' and 4" as shown in FIG. 14. Then at step S2, the flexible wiring board 4 is placed in the peripheral portion 2a of the panel, and the corresponding terminals of the LCD panel 20 and the flexible wiring board 4 are aligned with each other. In the same manner as above, at step S3, the flexible wiring board 4' is placed in the peripheral portion 2a of the panel, and the corresponding terminals are aligned with each other. Then, at step S4, the flexible wiring board 4" is placed in the peripheral portion 2a of the panel and the corresponding terminals are aligned with each other in the same manner as above. Subsequently, at step S5, all the corresponding terminals are connected with each other collectively. At step S6, inspection of the connection condition and the operation test of the drive ICs are performed collectively. Because the method of collective connection of all the flexible wiring boards has a reduced number of steps, as compared with the method of individual connection of the flexible wiring boards, further cost reduction is achieved. Furthermore, since the connection conditions at the input terminals and at the output terminals can be made identical, reliability of the module increases.

The wiring boards 4, 4' and 4" can be connected with the LCD panel one by one in accordance with the flow of FIG. 23 which will now be described. Firstly at step S11, the connection material 6 is supplied to the flexible wiring boards 4, 4' and 4" in the same manner as at step S1 of FIG. 22. Then at step S12, the flexible wiring board 4 is placed in the peripheral portion 2a of the panel, and the corresponding terminals are aligned and connected with each other. Subsequently, at step S13, the inspection of the connection condition and the operation test of the drive IC are performed. When any defective connection or malfunction is taking place, reworking is performed. The operations same as those at the steps S12 and S13 are carried out for the other flexible wiring boards 4' and 4" at steps S14 and S15 and at steps S16 and S17 respectively.

Figure 23:
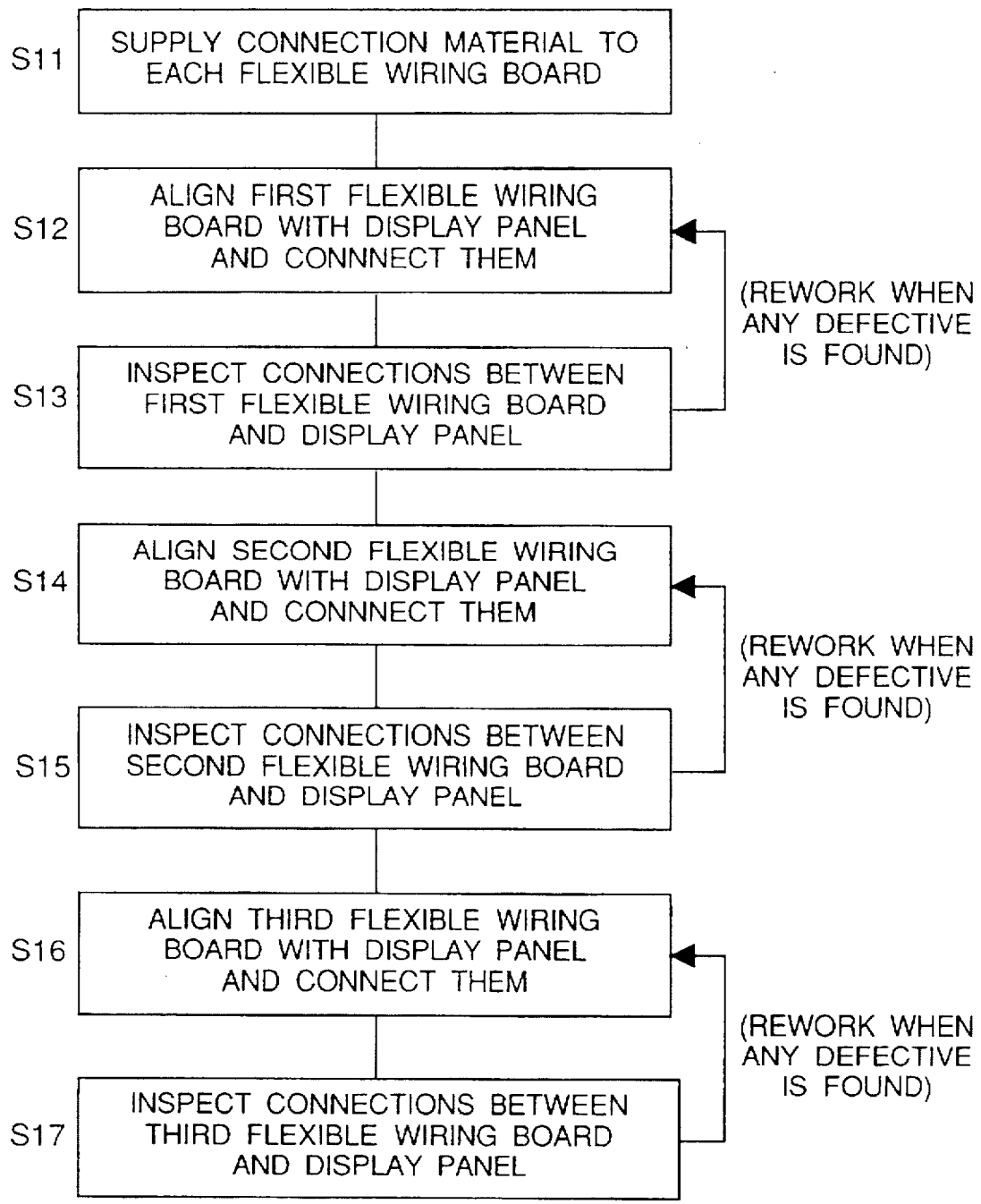
FIG. 23 is a flowchart of another method of assembling a liquid crystal display module of the present invention.

In the connection method of FIG. 23, each time the connection of one flexible wiring board is completed, the connection condition inspection and the operation test of the drive IC are performed before the next flexible wiring board is connected. Therefore, any flexible wiring board having connection failure and/or having a malfunctioning drive IC mounted thereon is immediately replaced. This assembly method is useful especially if the connection conditions are not stable, if the drive ICs are likely to easily break down electrostatically, or if the drive ICs are employed without inspection. With this method, there is possibility that in such cases the number of steps decrease as a whole in comparison with the method performing the operation test for the drive ICs of all flexible wiring boards after the module is completely assembled.

Figure 24:
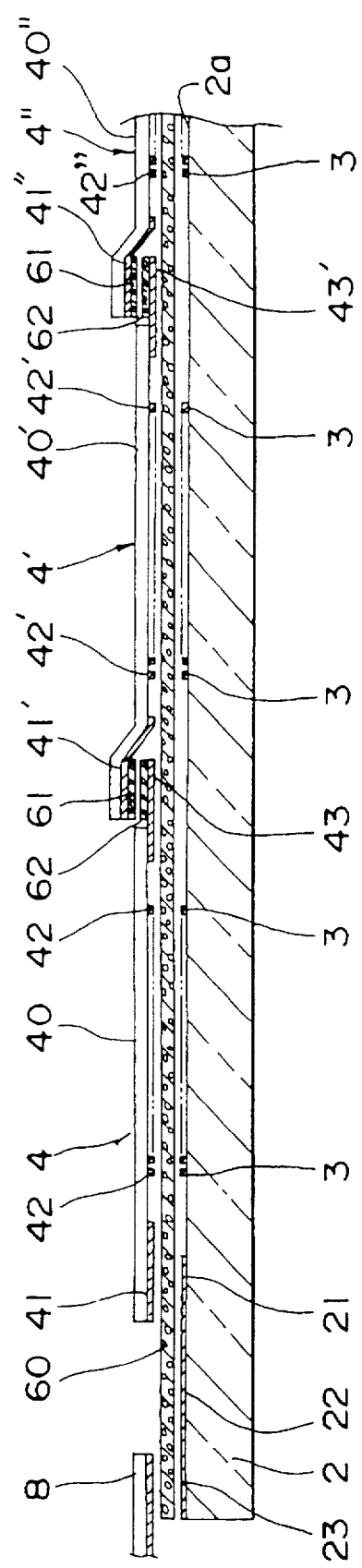
FIG. 24 is a sectional view of essential portions of a liquid crystal module according to the present invention, showing that different types of connection materials are used for connection on the side of the input terminals and on the side the output terminals of the flexible wiring board.

FIG. 24 shows an example in which the assembling is performed by employing connection materials of different types for the output terminals of the first, second and third flexible wiring boards 4, 4' and 4" from their input terminals. Specifically, the output terminals 42, 42', 42" of the flexible wiring boards 4, 4' and 4" are connected with respective ones of the electrode terminals 3 of each group in the panel peripheral portion by means of an anisotropic conductive film 60 which serves as a first connection material. On the other hand, in the spaces between the groups of the electrode terminals 3, the input terminals 41' of the second flexible wiring board 4', for example, are connected with the junction terminals 43 of the first flexible wiring board 4 by means of solders 61 and 62 which serve as a second connection material. In the same manner as above, the input terminals 41" of the third flexible wiring board 4" are connected with the junction terminals 43' of the second flexible wiring board 4' by means of the solders 61 and 62. In this example, the connector terminals 23 and the connector 8 are connected with each other by means of the anisotropic conductive film 60.

Figure 25:
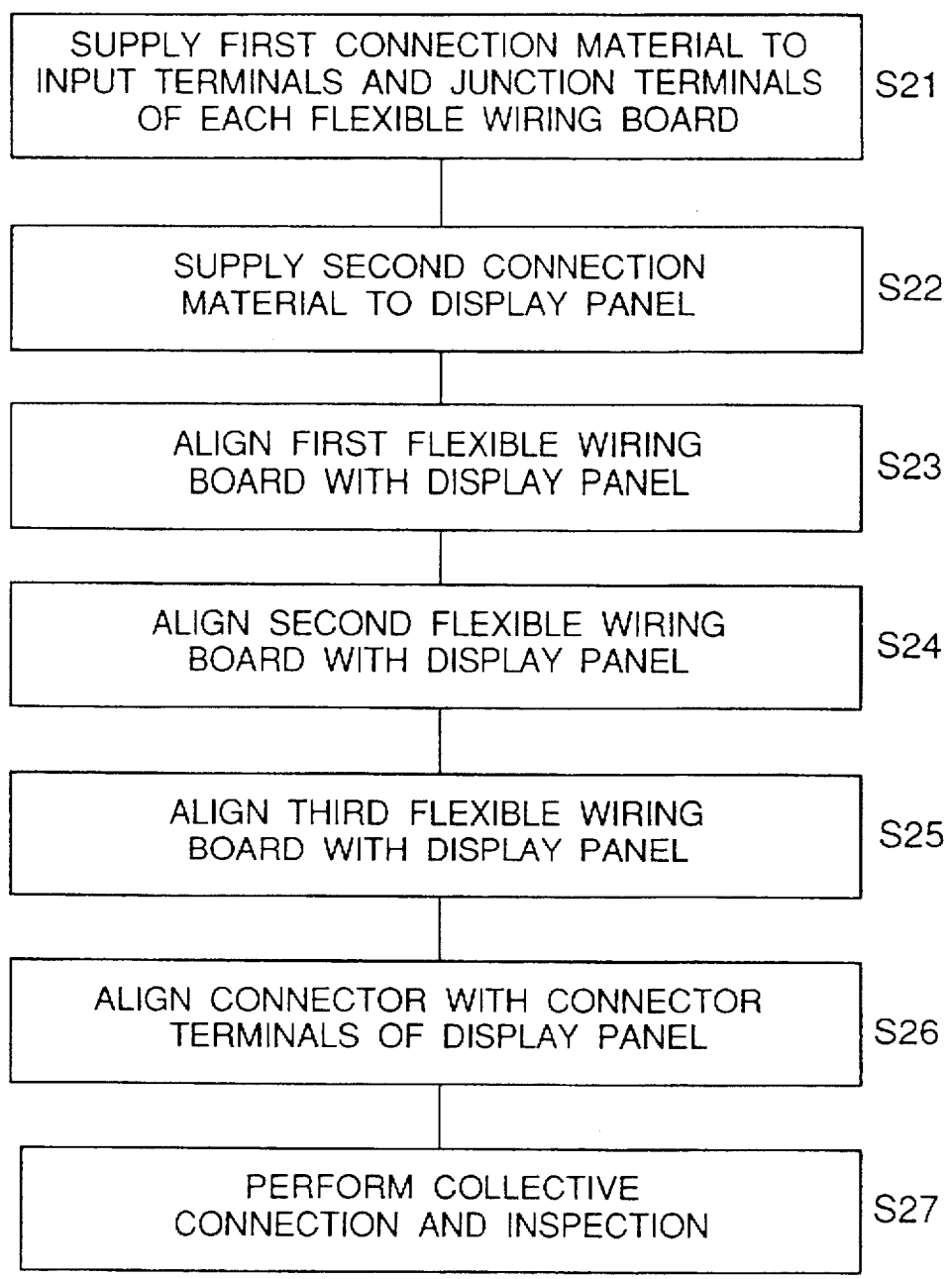
FIG. 25 is a flowchart of a method of assembling the liquid crystal display module of FIG. 24.

Assembling of the LCD module of FIG. 24 is carried out in accordance with the flowchart of FIG. 25. Firstly at step S21, the solders 61, 62, . . . , the second connection material, are supplied to the input terminals and the junction terminals (except for the input terminals of the leftmost, first flexible wiring board 4) of the flexible wiring boards 4, 4' and 4". It should be noted that the solder may be supplied to either of the input terminals and the junction terminals. Then at step S22, an anisotropic conductive film 60 is supplied to the area covering the electrode terminals 3 of each group, junction terminals 21, and connector terminals 23 in the peripheral portion 2a of the panel. Then at step S23, the flexible wiring board 4 is placed on the peripheral portion 2a of the panel, and the corresponding terminals of the flexible wiring board 4 and of the panel substrate 2 are aligned with each other. In the same manner as above, at step S24, the flexible wiring board 4, is placed on the peripheral portion 2a of the panel, and the corresponding terminals are aligned with each other. In the same manner as above, at step S25, the flexible wiring board 4" is placed on the peripheral portion 2a of the panel and the corresponding terminals are aligned with each other. Further at step S26, the connector 8 is arranged in the peripheral portion 2a of the panel and aligned with the connector terminals 23. Subsequently, at step S27, all the corresponding terminals are bonded and connected with each other collectively and simultaneously, and inspection of the connection condition and the operation test of the drive ICs are performed collectively.

When connection materials of different types are employed on the side of the output terminals and on the side of the input terminals of the flexible wiring boards 4, 4' and 4", connection materials satisfying the resistance specifications for the connected portions can be selected. Reliability of the device is thereby improved. In particular, since the first connection material is the anisotropic conductive film and the second connection material is the solder, the existing equipments and know-how of the existing connection techniques can be utilized. Therefore, mass-production of modules can be achieved in a short time with a small investment.

Figure 26:
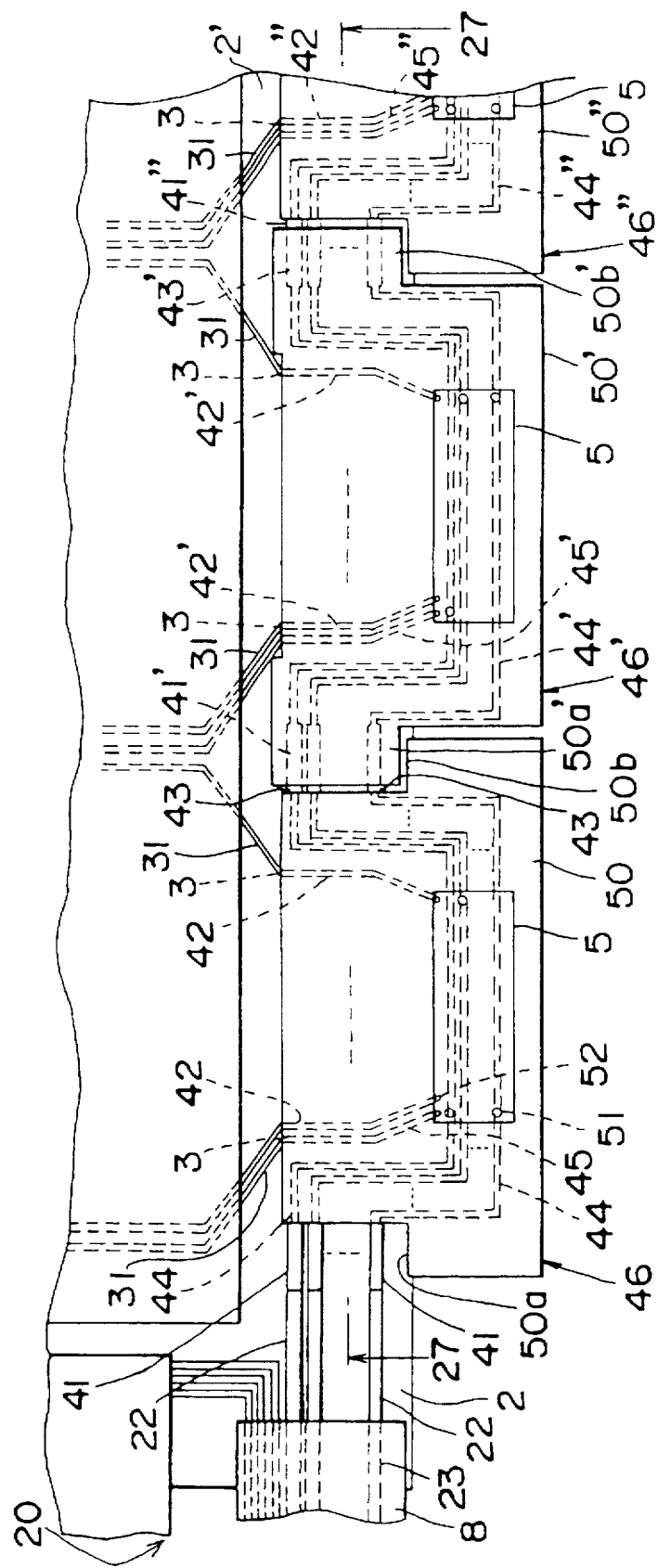
FIG. 26 is a plan view of essential parts of a liquid crystal display module of another embodiment of the present invention.
Figure 27:
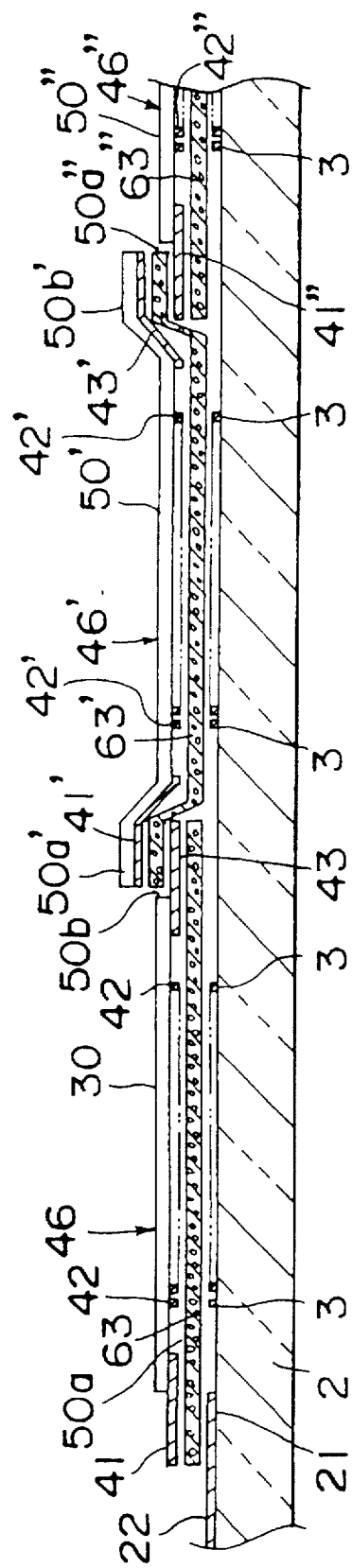
FIG. 27 is a sectional view taken along line 27—27 of FIG. 26.

FIG. 26 shows an example in which flexible wiring boards having different constructions are assigned to the odd-number groups of the electrode terminals and the even-number groups of the electrode terminals provided in the panel peripheral portion 2a. FIG. 27 shows a sectional view taken along the line 27—27 in FIG. 26. In the odd-number flexible wiring board, for example, the leftmost, first flexible wiring board 46, its generally rectangularly shaped substrate 50 is provided with rectangular recesses 50a and 50b in those portions where the input terminals 41 and the junction terminals 43 are respectively present. The third flexible wiring board 46" has the same construction as that of the first flexible wiring board 46. On the other hand, in the even-number flexible wiring board, for example, the second flexible wiring board 46', its generally rectangular substrate 50' is provided with rectangular protrusions 50a' and 50b' in those areas where the input terminals 41' and the junction terminals 43' are respectively present. The other portions of the flexible wiring boards 46, 46', and 46" have the same constructions as that of the flexible wiring board 4 shown in FIG. 16.

Figure 28:
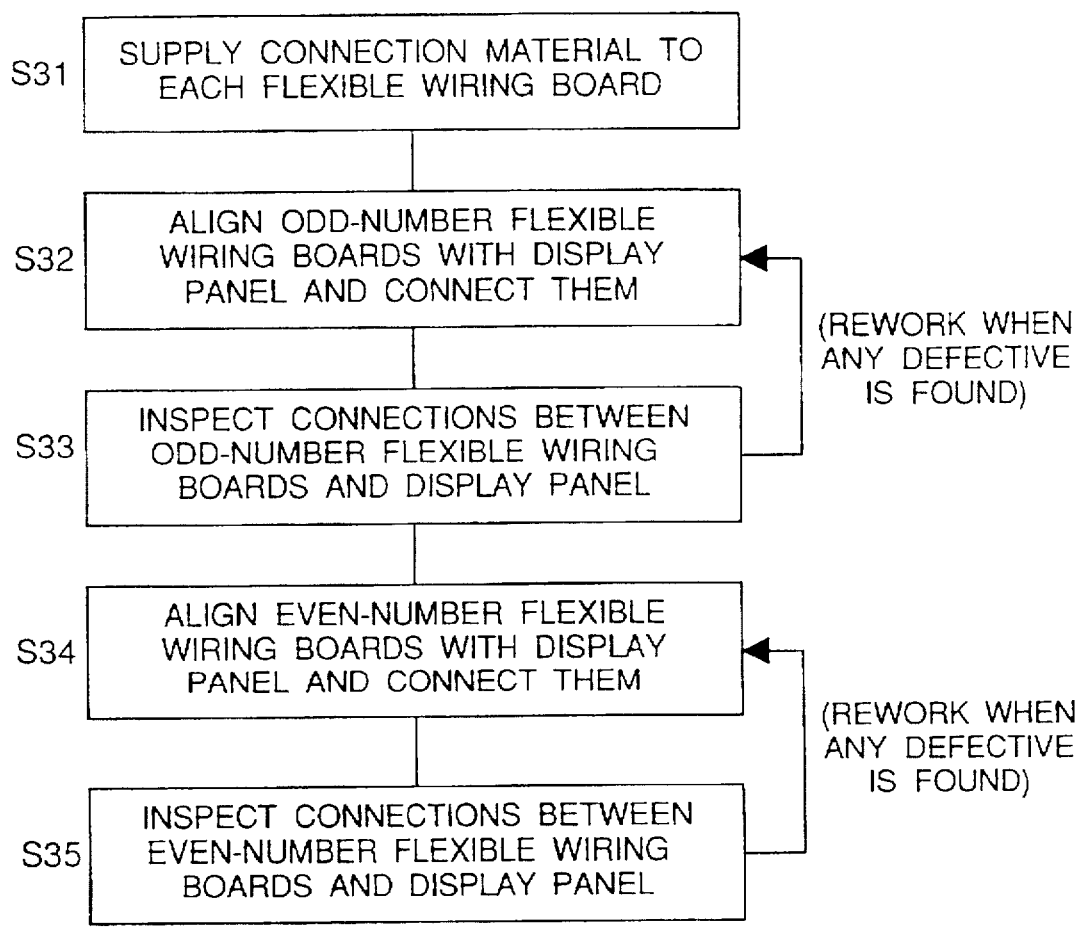
FIG. 28 is a flowchart showing steps of assembling the liquid crystal display module of FIG. 26.

Assembling of the LCD module of FIGS. 26 and 27 is carried out as shown in the flowchart of FIG. 28. At step S31, anisotropic conductive films 63, 63', and 63" are supplied as a connection material to the output terminals, input terminals, and junction terminals of each of the flexible wiring boards 46, 46', and 46". Then at step S32, the first and second flexible wiring boards 46 and 46" are placed on the panel peripheral portion 2a such that the output terminals 42, 42" of these flexible wiring boards are aligned with the odd-number groups (in this example, first and third groups) of the electrode terminals 3 of the panel. Then, the aligned terminals are bonded with their respective counterparts. Then at step S33, inspection of the connection condition of the bonded flexible wiring boards 46 and 46" 1 and the operation test of the drive ICs 5 are performed. When any connection failure or malfunction (e.g., electrostatic breakdown of the drive IC) is found, reworking is performed at this stage by replacing the relevant defective flexible wiring board with a new one. Removal of such defective flexible wiring board is easy because the flexible wiring boards 46 and 46" are spaced from each other and not superposed on each other at this stage.

Then at step S34, the second flexible wiring board 46' is placed on the peripheral portion 2a of the panel, and the output terminals 42', input terminals 41', and junction terminals 43' of the flexible wiring board 46' are aligned with the electrode terminals 3 of the second group, the junction terminals 43 of the first flexible wiring board 46, and the input terminals 41" of the third flexible wiring board 46", respectively. Then, those terminals of the second flexible wiring board 46' are bonded with their respective counterparts. Then at step S35, inspection of the connection condition of the connected flexible wiring board 46' and the operation test of the drive IC 5 are performed. When any connection failure or malfunction (e.g., electrostatic breakdown of the drive IC) is found, reworking is performed at this stage by replacing the defective flexible wiring board with a new one. Removal of such defective flexible wiring board is easy because the flexible wiring board 46' is disposed on the upper side of the previously connected flexible wiring boards 46 and 46". As described above, according to this assembling method, only the flexible wiring board which is found to be defective can be replaced independent of the other, good flexible wiring boards and therefore easily.

Figure 29:
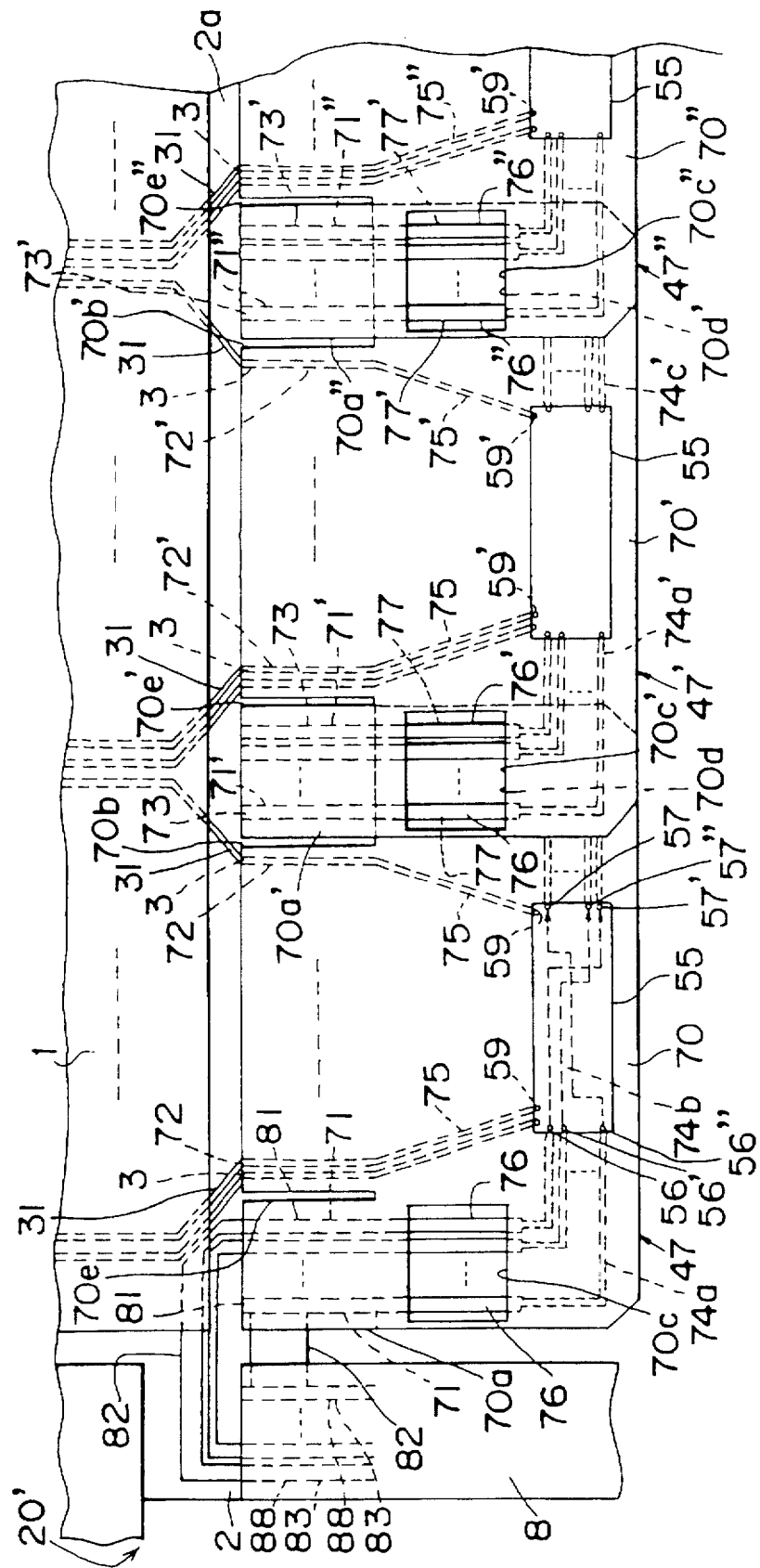
FIG. 29 is a plan view of essential parts of a liquid crystal display module of another embodiment of the present invention.
Figure 30:
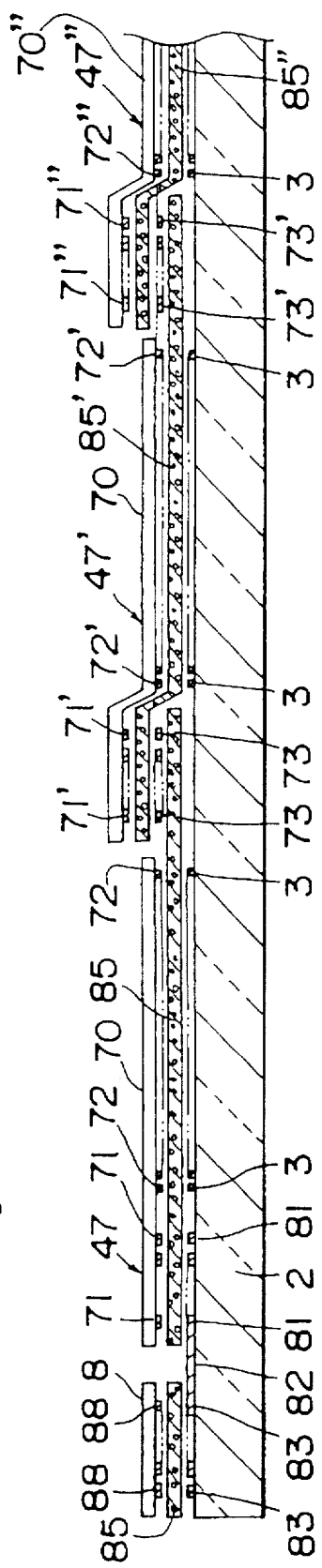
FIG. 30 is a sectional view of a panel peripheral portion of the liquid crystal display module of FIG. 29.

FIGS. 29 and 30 show another LCD module in accordance with the present invention. FIG. 29 shows a top plan view of a peripheral portion on a side of an LCD panel 20' and flexible wiring boards 47, 47', and 47", while FIG. 30 shows a sectional view of the peripheral portion of the panel. As shown in FIG. 29, in a peripheral portion 2a of the LCD panel 20' (more specifically, of a glass substrate 2), there are provided a plurality of electrode terminals 3 along the length of the peripheral portion 2a in the same manner as in the LCD panel 20 shown in FIGS. 13, 14 and 15. The electrode terminals 3 are divided in groups corresponding to the flexible wiring boards 47, 47', and 47", and the adjacent groups of the electrode terminals are spaced from each other. The electrode terminals 3 are connected to pixels (not shown) inside of the panel via wirings 31. At a corner of the peripheral portion 2a of the panel are provided circuit wirings 82 which have a generally U-shaped pattern (including a rectangular pattern) and serve to transmit signals to the drive IC 5. The circuit wirings 82 are composed of the same layer as that of the electrode terminals 3. An end portion proximate to the electrode terminals 3 of each circuit wiring 82 serves as a junction terminal 81, while the opposite end serves as a connector terminal 83.

Figure 31:
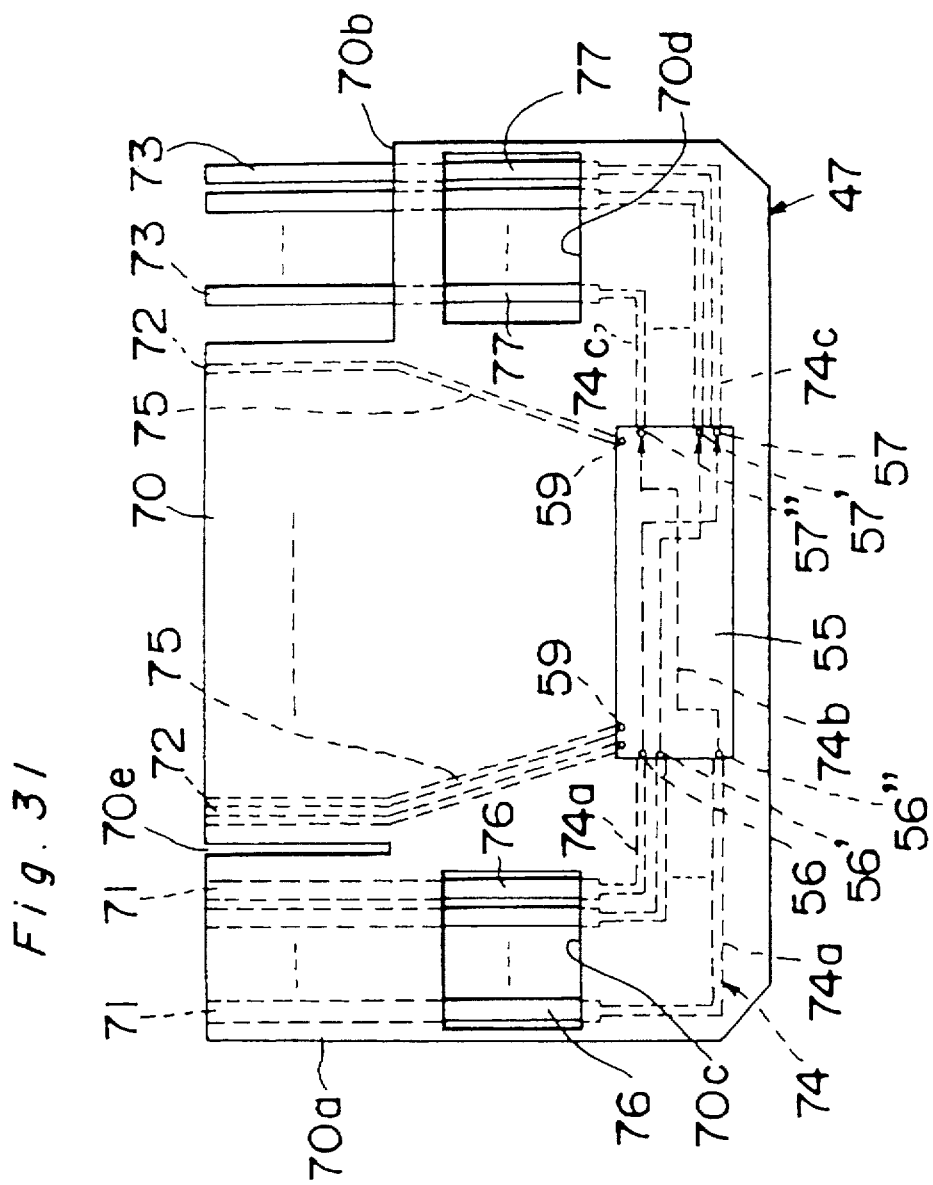
FIG. 31 is a plan view of a flexible wiring board for use in the liquid crystal display module of FIG. 29.
Figure 32:
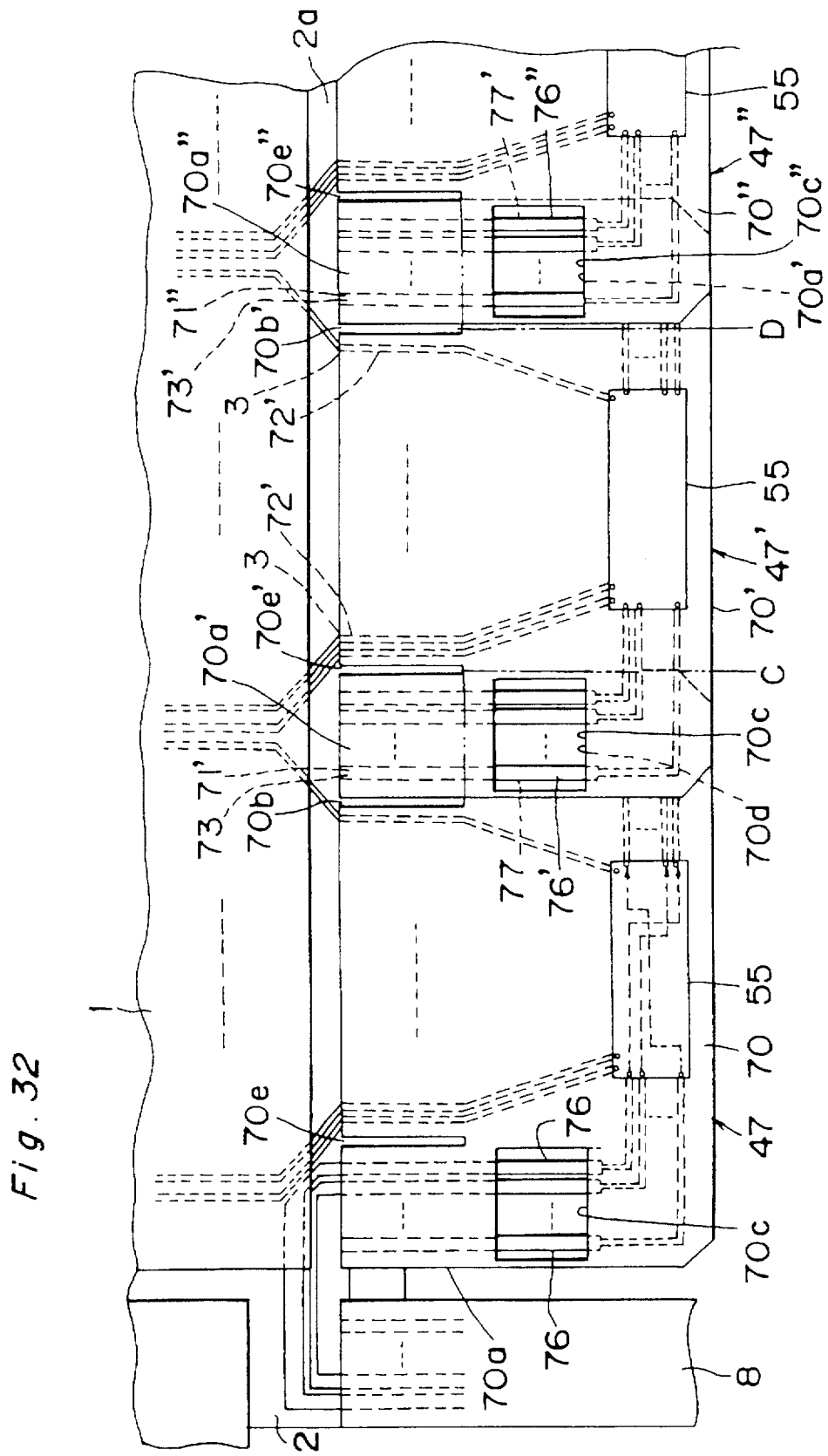

Meanwhile, as shown in FIG. 31, the flexible wiring board 47 (having the same construction as the flexible wiring boards 47' and 47") has its flexible substrate 70 mounted with a drive IC 55 and a wiring layer connected to the drive IC. The wiring layer is provided on the rear surface of the substrate, and includes input terminals 71, output terminals 72, and junction terminals 73. The output terminals 72, input terminals 71, and junction terminals 73 are provided in positions corresponding respectively to the group of the electrode terminals 3 provided in the peripheral portion 2a of the panel, a space on the left-hand side in FIG. 31 of the electrode terminal group, and a space on the right-hand side in FIG. 31 of the electrode terminal group. The generally rectangular substrate 70 has a rectangular recess 70b in a position where the junction terminals 73 are located. In the present example, the input terminals 71 are backed with another substrate 70a. Furthermore, the substrate 70 is provided with a slit 70e in a position between the input terminals 71 and the output terminals 72. The rectangular recess 70b and the adjacent flexible wiring board define a slit after completion of the assembling. The flexible wiring board 47 is provided with circuit wirings 74 which have an approximately U-shaped pattern and extend beneath the drive IC to connect the input terminals 71 with the junction terminals 73. The circuit wirings 74 are provided with auxiliary input terminals 76 adjacent to the input terminals 71 and with auxiliary junction terminals 77 adjacent to the junction terminals 73. The substrate 70 is provided with rectangular holes 70c and 70d in positions where the auxiliary input terminals 76 and the auxiliary junction terminals 77 are respectively located. The output terminals 72 are connected with the drive IC 55 via wirings 75, while the input terminals 71 are connected with the drive IC 55 via the circuit wirings 74 extending beneath the drive IC 55. The drive IC 55 is connected with the wirings 74 and 75 via bump electrodes (of which only some 56, 56', 56" and 59 are shown).

The drive IC 55 is provided with wirings 74b which have a pattern for reversing the order of arrangement of signals input to the bump electrodes 56, 56', . . . , 56". The signals input to the bumps 56, 56', . . . . 56" 1 appear in the reversed order at bumps 57, 57', . . . , 57" provided on the opposite side. Consequently, the signals are supplied to the input terminals of the adjacent flexible wiring boards in the same order of arrangement as the original order of arrangement after completion of the assembling.

The assembling may be performed as follows according to the flow similar to the flow shown in FIG. 22. First at step S1, connection material 85 is supplied to the flexible wiring boards 47, 47', and 47". Then at step S2, the first flexible wiring board 47 is placed on the peripheral portion 2a of the panel, and the corresponding terminals of the flexible wiring boards and the panel are aligned with each other. At step S3, the second flexible wiring board 47' is placed on the peripheral portion 2a of the panel, and the corresponding terminals are aligned with each other. Then, at step S4, the third flexible wiring board 47" is placed on the peripheral portion 2a of the panel, and the corresponding terminals are aligned with each other. Subsequently, at step S5, all the corresponding terminals are collectively connected with each other at the same time. Further at step S6, inspection of the connection condition and the operation test of the drive ICs are performed collectively. The advantages of this assembling method has been described above.

In the operation stage, a drive signal is supplied from a control board (not shown) to the circuit wirings 82 provided in the peripheral portion 2a of the panel by way of electrode terminals 88 and junction terminals 83 of the connector 8 shown in FIG. 29. The signal is input from the junction terminals 81 to the drive IC 55 mounted on the flexible wiring board 4 by way of the input terminals 71 and the circuit wirings 74 of the flexible wiring board 4. A signal output from the drive IC 55 is supplied to the pixels (not shown) of the LCD panel 20' by way of the wirings 75 and output terminals 72 of the flexible wiring board 4 and the electrode terminals 3 of the first group and the wirings 31 of the display panel substrate. Thus, the LCD panel 20' is driven. The above-mentioned drive signal is diverged at the bump portions 56, 56', . . . , 56" and supplied to the input terminals 71' of the next flexible wiring board 47' by way of the circuit wirings 74b of the drive IC 55, and circuit wirings 74c and junction terminals 73 of the flexible wiring board 47. Then the signal is input from the input terminals 71' to the drive IC 55 by way of the circuit wirings 74' of the flexible wiring board 47'. The signal output from the drive IC 55 is supplied to the inside of the panel by way of the output terminals 72' of the flexible wiring board 47' and the electrode terminals 3 of the second group provided in the peripheral portion of the panel. In this way, the signal from the control board is successively supplied to the juxtaposed flexible wiring boards 47, 47' and 47".

The LCD module of FIGS. 29 and 30 can produce the effects of reducing the number of parts, reducing the number of steps of assembling, reducing the module weight, reducing the module size, reducing the cost, and improving the reliability as the LCD module shown in FIGS. 13 and 14 does. Furthermore, when a drive IC mounted on a particular flexible wiring board is found to be defective after the assembling process, the defective drive IC can be easily replaced in the following manner.

It is now assumed that the drive IC 55 of the second flexible wiring board 47' included in an LCD module on the market becomes defective. First, a substrate 70' portion protruding sidewise from the peripheral portion 2a of the panel is cut on the lines C and D to the slits 70e' and 70b'. Since the substrate portion to be cut does not overlap the panel peripheral portion, the substrate can be easily cut. Then, the output terminals 72' are separated from the electrode terminals 3 of the second group on the peripheral portion 2a of the panel. With these works, the center portion including the output terminals 72' and the drive IC 55 of the substrate 70' is removed while leaving the lateral portion on the left-hand side where the input terminals 71' and the auxiliary input terminals 76' of the substrate 70' are located as well as the lateral portion on the right-hand side where the junction terminals 73' and the auxiliary junction terminals 77' are located, as shown in FIG. 33. The connection material remaining on the relevant electrode terminals 3 is wiped off by a solvent or the like. Then a new flexible wiring board having the same construction as that of the flexible wiring board 47' is placed between the first and third flexible wiring boards 47 and 47" 1 with its output terminals, auxiliary input terminals, and auxiliary junction terminals being aligned respectively with the electrode terminals 3 of the second group of the peripheral portion 2a of the panel, the auxiliary input terminals 76', and the auxiliary junction terminals 77' (input terminals 71" of the adjacent flexible wiring board 47"), followed by the connection of the terminals. In this way the defective drive IC 55 is replaced with a new one. A flexible wiring board 48 having neither input terminals nor junction terminals as shown in FIG. 34 may be employed as a replacement. The flexible wiring board 48 is different from the flexible wiring boards 47 of FIG. 31 only in that the substrate 90 of the flexible wiring board 48 is cut out at locations 90a' and 90b' for the input terminals and junction terminals which are unnecessary for reworking.

Figure 19:
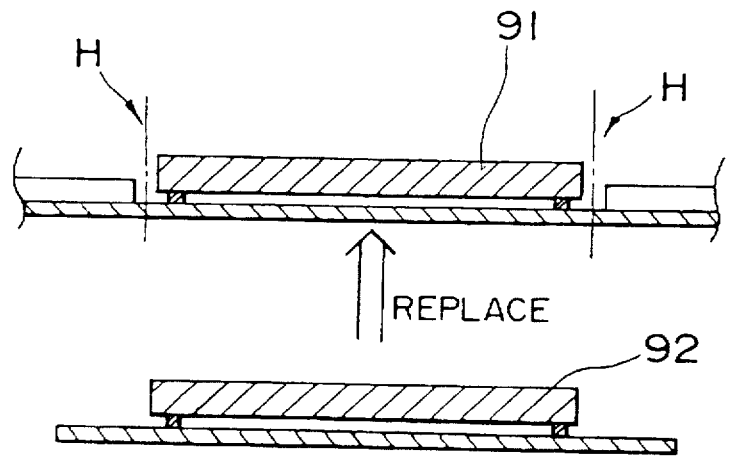
FIG. 19 is an explanatory schematic view to explain the way to replace a drive IC.

For reworking, the following method may be employed instead of the above-described method:

i) a method of adopting a pressure-welding structure by means of a clip as shown in FIG. 21 and removing the clip in replacement;

ii) a method of making the drive IC 5 have solder bumps 53 and 54 as shown in FIG. 18 and replacing only the drive IC 5 with a new drive IC; or iii) a method of initially not applying a protection resin 9 shown in FIG. 17, and removing a defective IC 91, when found, by cutting it on the lines H and H and then connecting a new IC 92 in a manner as shown in FIG. 19, and thereafter applying a protection resin coating (Japanese Patent Publication No. HEI 3-29304 issued in 1991).

Figure 35:
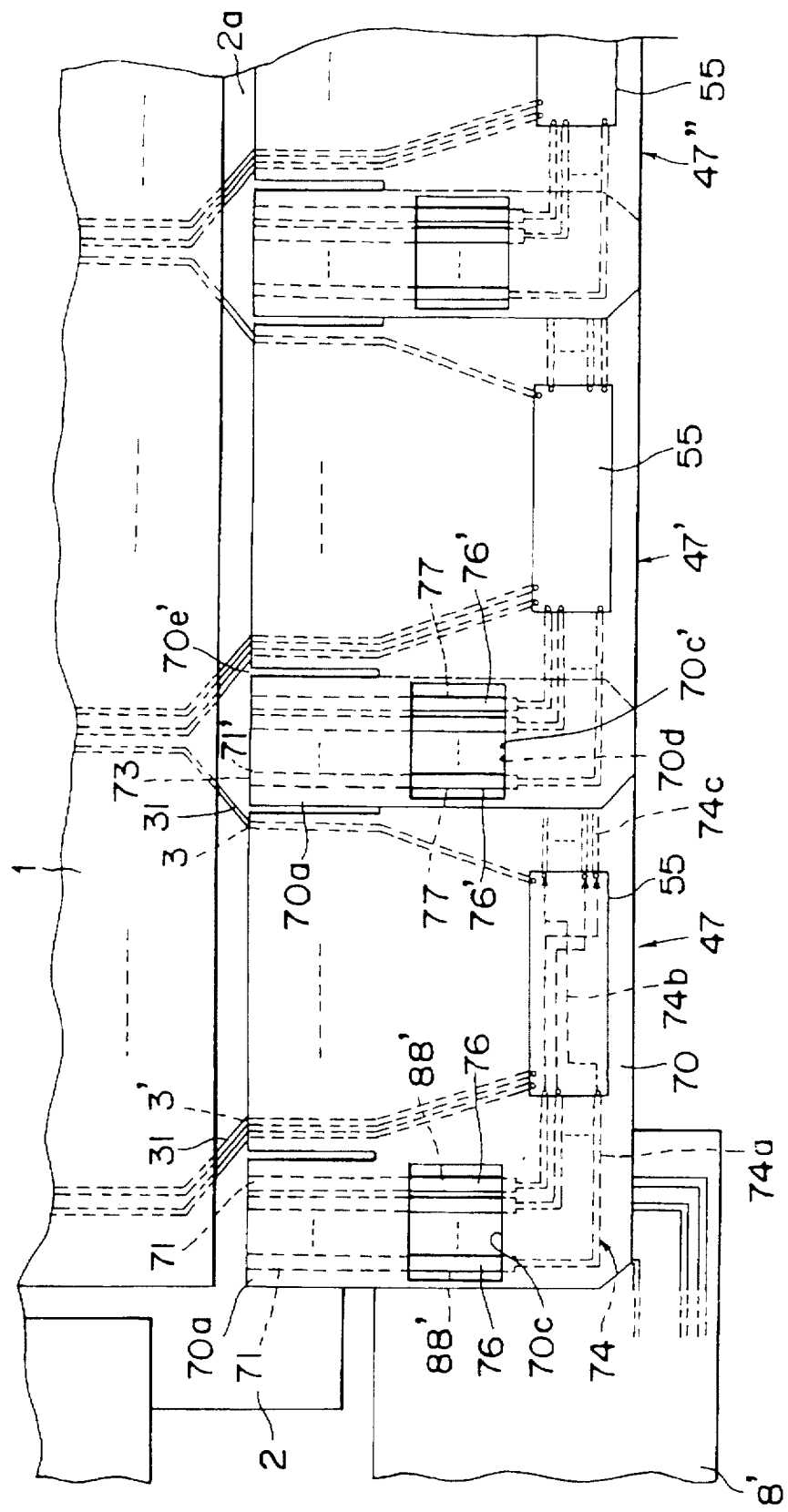
FIG. 35 is a plan view of essential parts of a variant of the liquid crystal display module of FIG. 29.

FIG. 35 shows a modification of the assembly structure shown in FIGS. 29 and 30. In the assembly structure of FIG. 35, electrode terminals 88' of a control board 8' are directly connected with the auxiliary input terminals 76 of the leftmost, first flexible wiring board 47. The signal can be supplied directly from the electrode terminals 88' to the auxiliary input terminals 76 of the flexible wiring board 47. This arrangement dispenses with the connector 8 for connecting the control board with the flexible wiring board, resulting in decrease of the number of necessary parts and hence weight reduction of the device. Furthermore, the number of connection portions and the number of steps of the assembling can be reduced, and thus further cost reduction can be achieved.

Although only three flexible wiring boards are arranged in the peripheral portion of the panel in the above-described embodiments, the present invention can also employ a varied number of flexible wiring boards. Furthermore, the present invention can be applied not only to one side of the panel but also to more sides concurrently.

Furthermore, the present invention is not limited to the liquid crystal display device, and it may be applied to other types of display devices such as an EL display device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A display panel assembly, comprising:

a display panel having a plurality of electrode terminals extending perpendicular to sides of the display panel and arranged along the sides in a peripheral portion of the display panel, wherein the electrode terminals are divided into groups and the groups of the electrode terminals are spaced from each other;

flexible wiring boards overlapping the display panel at the peripheral portion, each of which is mounted with a drive circuit for driving the display panel, each flexible wiring having (a) a wiring layer which is connected with the drive circuit and which includes input terminals, output terminals and junction terminals and (b) circuit wirings connecting the input terminals with the junction terminals of the flexible wiring board; and circuit wirings connected with the input terminals of only one of the flexible wiring board for transmitting a control signal received from outside to the drive circuits, said output terminals of each flexible wiring board are connected in a superposed manner with an associated group of the electrode terminals, and said junction terminals of at least one flexible wiring board are connected in a superposed manner with the input terminals of the adjacent flexible wiring board, connected portions of the junction and input terminals of the adjacent flexible wiring boards being located on the peripheral portion of the display panel in a space between the adjacent groups of the electrode terminals.

2. The display panel assembly as claimed in claim 1, wherein the output terminals of each flexible wiring board are connected with the associated group of the electrode terminals through a first connection material and the junction terminals of each flexible wiring board are connected with the input terminals of the adjacent flexible wiring board through a second connection material.

3. The display panel assembly as claimed in claim 2, wherein the first connection material is of a same type as the second connection material.

4. The display panel assembly as claimed in claim 3, wherein each of the first and second connection materials is an anisotropic conductive film.

5. The display panel assembly as claimed in claim 1, wherein circuit wirings for transmitting the control signal to the drive circuits are provided at a corner of the peripheral portion of the display panel, and these circuit wirings are connected with the input terminals or the junction terminals of a flexible wiring board arranged closest to the corner of all of the plurality of flexible wiring boards.

6. The display panel assembly structure as claimed in claim 1, wherein a control board having circuit wirings for transmitting the control signal to the drive circuits is provided in the vicinity of the display panel, and the circuit wirings of the control board are connected with the input terminals or the junction terminals of a flexible wiring board closest to a corner of the peripheral portion of all of the plurality of flexible wiring boards.

7. The display panel assembly of claim 1 wherein the flexible wiring boards are arranged in a plane parallel with a plane of the display panel.

8. The display panel assembly of claim 1 wherein the flexible wiring boards each include a rectangular protruding portion on which said input terminals are disposed and a rectangular recess portion in which said junction terminals are disposed.

9. A flexible wiring board to be connected with a display panel, comprising:

a flexible substrate;

a single drive circuit mounted on the substrate for driving the display panel;

a wiring layer provided on the substrate and connected with the drive circuit;

an array of output terminals to be connected with electrode terminals of the display panel, input terminals provided on one side of the array of the output terminals for receiving a control signal for the drive circuit from outside, and junction terminals provided on the other side of the array of the output terminals and connected with the input terminals by circuit wirings and adapted to be connected with input terminals of another flexible wiring board of same construction, either the input terminals or the junction terminals being not covered with the flexible substrate such that the junction terminals of this flexible wiring board and the input terminals of said another flexible wiring board are superposed on each other when connected with each other; and the output terminals, input terminals and junction terminals forming part of the wiring layer.

10. The flexible wiring board of claim 9 further including auxiliary input terminals and auxiliary junction terminals formed on the circuit wirings in the vicinity of the input terminals and the junction terminals, respectively.

11. The flexible wiring board of claim 9 wherein said flexible substrate includes a rectangular protruding portion on which said input terminals are disposed and a rectangular recess portion in which said junction terminals are disposed.

* * * * *